(12) United States Patent
Chen et al.

(10) Patent No.: US 7,736,949 B2
(45) Date of Patent: Jun. 15, 2010

(54) DEVICE AND METHOD FOR FABRICATING DOUBLE-SIDED SOI WAFER SCALE PACKAGE WITH OPTICAL THROUGH VIA CONNECTIONS

(75) Inventors: Howard Hao Chen, Yorktown Heights, NY (US); Louis Lu-Chen Hsu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/199,063

(22) Filed: Aug. 27, 2008

(65) Prior Publication Data
US 2008/0318360 A1 Dec. 25, 2008

Related U.S. Application Data

(60) Division of application No. 11/325,105, filed on Jan. 4, 2006, now Pat. No. 7,489,025, which is a continuation-in-part of application No. 10/990,252, filed on Nov. 16, 2004, now Pat. No. 7,098,070.

(51) Int. Cl.
*H01L 21/00* (2006.01)

(52) U.S. Cl. .............. 438/106; 438/108; 257/E23.004

(58) Field of Classification Search ............... 438/106, 438/108, 123; 257/E23.004, E23.062, E23.069
See application file for complete search history.

(56) References Cited

U.S. PATENT DOCUMENTS

| | | | |
|---|---|---|---|
| 5,394,490 | A | 2/1995 | Kato et al. |
| 5,987,198 | A | 11/1999 | Hirota et al. |
| 6,355,501 | B1 | 3/2002 | Fung et al. |
| 6,548,391 | B1 | 4/2003 | Ramm et al. |
| 6,607,938 | B2 | 8/2003 | Kwon et al. |
| 6,645,832 | B2 | 11/2003 | Kim et al. |
| 6,730,541 | B2 | 5/2004 | Heinen et al. |
| 6,737,297 | B2 | 5/2004 | Pogge et al. |
| 6,762,076 | B2 | 7/2004 | Kim et al. |
| 2003/0148552 | A1 | 8/2003 | Halahan |
| 2004/0155337 | A1* | 8/2004 | Strandberg et al. .......... 257/738 |

FOREIGN PATENT DOCUMENTS

| | | |
|---|---|---|
| CN | 1185655 | 6/1998 |
| CN | 1214545 | 4/1999 |

* cited by examiner

*Primary Examiner*—Walter L Lindsay, Jr.
(74) *Attorney, Agent, or Firm*—Tutunjian & Bitetto, P.C.; Brian Verminski, Esq.

(57) ABSTRACT

A semiconductor package includes an SOI wafer having a first side including an integrated circuit system, and a second side, opposite the first side, forming at least one cavity. At least one chip or component is placed in the cavity. An optical through via is formed through a buried oxide which optically connects the chip(s) to the integrated circuit system.

13 Claims, 27 Drawing Sheets

DEVICE AND METHOD FOR FABRICATING DOUBLE-SIDED SOI WAFER SCALE PACKAGE WITH OPTICAL THROUGH VIA CONNECTIONS

RELATED APPLICATION DATA

This application is a Divisional of U.S. patent application Ser. No. 11/325,105, filed on Jan. 4, 2006 now U.S. Pat. No. 7,489,025, and incorporated herein by reference, which is a Continuation in Part of U.S. patent application Ser. No. 10/990,252, filed on Nov. 16, 2004, now U.S. Pat. No. 7,098,070, issued on Aug. 29, 2006.

BACKGROUND OF THE INVENTION

1. Field of the Invention

The present invention relates to semiconductor processing and devices, and more particularly to devices and methods, which employ silicon-on-insulator (SOI) technology to provide a double-sided chip structure.

2. Description of the Related Art

As the relentless scaling of complementary metal oxide semiconductor (CMOS) technology approaches its physical limit, the integration of very large-scale integrated circuit (VLSI) systems on a package (SoP) becomes increasingly important. The integration of many different chips on a package is often not cost effective, due to the incompatibility between various chip technologies. For example, non-volatile random access memory (NVRAM) with floating gate devices and dynamic random access memory (DRAM) with deep trenches require additional masks and processing steps to fabricate. High-speed Gallium Arsenide (GaAs) chips are manufactured on a different substrate than a silicon chip.

An efficient method to integrate different chips on a two-dimensional (2-D) or three-dimension (3-D) package can not only enhance circuit performance but also reduce manufacturing cost. If the chips are stacked vertically, the through vias should also be used to further reduce the interconnect delay and maximize circuit performance.

Advanced three-dimensional wafer-to-wafer vertical stack integration technology has recently been developed to improve system performance. In U.S. Pat. No. 6,645,832, entitled "Etch stop layer for silicon via etch in three-dimensional wafer-to-wafer vertical stack", a method of using nickel silicide (NiSi) as an etch stop layer for the silicon via etch is described. In a 3-D package, a dielectric layer is used to bond the two vertically stacked wafers, and a silicon via etch is required to provide electrical conductivity between the wafers.

The vias are formed by selectively etching through the silicon of the top wafer until stopped by the etch stop layer. The sidewalls of the silicon vias are coated with a layer of insulating material, forming a barrier layer. The vias are then filled with conductive material to provide electrical connection.

In U.S. Pat. No. 6,762,076, entitled "Process of vertically stacking multiple wafers supporting different active integrated circuit devices", a metal-to-metal bonding method is used to bond adjacent wafers and provide electrical connections.

In U.S. Pat. No. 6,355,501, entitled "Three-dimensional chip stacking assembly", multiple silicon-on-insulator (SOI) chips are stacked together and interconnects between chips are accomplished by aligning prefabricated contacts at the top and bottom surfaces of the chips. Each chip is thinned down significantly by backside chemical-mechanical-polishing (CMP) to remove all the material behind the buried oxide layer. In the 3-D assembly, each SOI chip includes a handler making mechanical contact to a first metallization pattern, the first metallization pattern making electrical contact to a semiconductor device, and the semiconductor device making electrical contact to a second metallization pattern on the opposite surface of the semiconductor device.

In U.S. Pat. No. 6,737,297, entitled "Process for making fine pitch connections between devices and structure made by the process", a method is disclosed to join two or more chips together on a temporary substrate with prefabricated global wirings by aligning the stud on the chip surface and the via on the temporary alignment substrate. The two-dimensional chip assembly is then transferred to a permanent support carrier with heat-sink devices, and the transparent plate of the temporary alignment structure is ablated and detached from the assembly.

In U.S. Pat. No. 6,607,938, entitled "Wafer level stack chip package and method for manufacturing same", the semiconductor chips are stacked on the redistribution substrate. After multiple thin chips on the corresponding wafers are stacked together, the stack-chip structures are cut out from the stack-wafer assembly and the carrier material is then stripped away.

In U.S. Pat. No. 6,730,541, entitled "Wafer-scale assembly of chip-size packages", a polymer film carrying solder balls for each of the contact pads is aligned with the wafer. Infrared energy is applied to the backside of the wafer to uniformly heat the wafer. The process is then repeated to sequentially assemble an interposer and a second polymer film carrying solder balls.

In U.S. Pat. No. 5,987,198, entitled, "Optical bus and optical bus production method including a plurality of light transmission paths", an optical bus method for producing a multilayer, horizontal optical bus is described. More specifically, each optical bus is formed by a light transmission layer sandwiched by two clad layers. A clearance layer is placed in between two adjacent optical buses. Such multi-layer optical bus system is used for data communications among the circuit boards without mention of how to employ the optical bus system to provide a data link among chips on a system on a chip (SOC) or system on a package (SOP).

In U.S. Pat. No. 5,394,490, entitled "Semiconductor device having an optical waveguide interposed in the space between electrode members", a co-existence of electrical interconnection and the optical waveguide is presented in a flip-chip package system. More specifically, an optical waveguide is interposed in the space between electrode members (or C4), in which signals can be simultaneously transmitted electrically or optically and thereby improve the throughput of the interconnections as a whole. This reference fails, among other things, to disclose how to form a vertical optical bus to link children chips to the mother chip in a SOC, or SOP system.

SUMMARY OF THE INVENTION

A semiconductor package includes a wafer having a first side including at least one electronic component, and a second side opposite the first side and forming a cavity. At least one chip is placed in the cavity. An optical through via connects the at least one chip to the at least one electronic component through a portion of the wafer.

Another semiconductor package includes at least one mother chip having a cavity on one side, and at least one a daughter chip mounted in the cavity and being connected to the at least one mother chip by an optical through via. The optical through via extends through at least a portion of the at least one mother chip such that the at least one mother chip and the at least one daughter chip optically coact to perform a function.

If the chips are stacked vertically, optical interconnects are provided for through vias and employed to further reduce interconnect delay and maximize circuit performance.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein:

FIG. 1B is a cross-sectional view showing a via hole opened up;

DETAILED DESCRIPTION OF PREFERRED EMBODIMENTS

Figure 1:
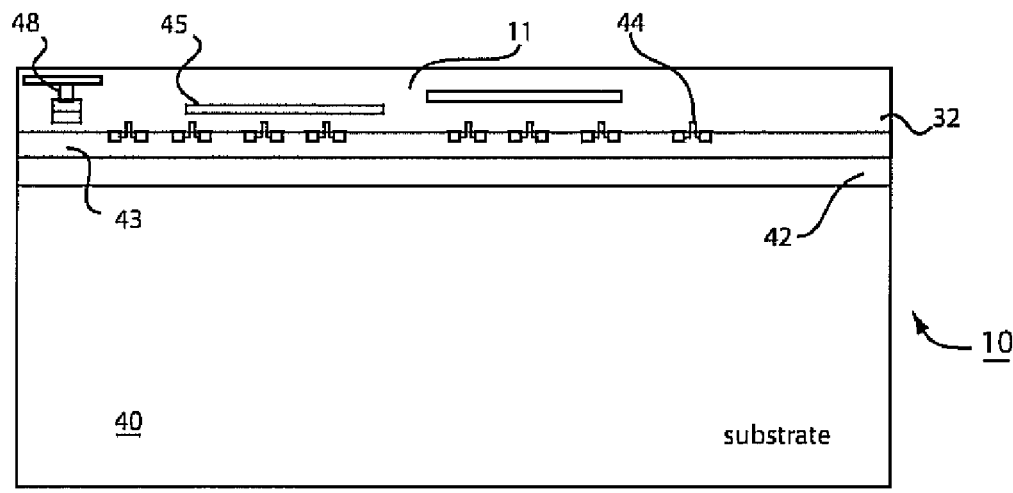
FIG. 1 is a cross-sectional view of a silicon-on-insulator structure/wafer showing electronic components formed thereon.

The present invention provides a low-cost and high-yield double-sided wafer scale package preferably on a silicon-on-insulator (SOI) wafer. A mother chip is formed on the front side of the SOI wafer with a fully or partially depleted body to achieve high performance. A plurality of thinned daughter chips is then mounted inside the cavities on the backside of the SOI wafer, opposite the mother chip. Through silicon and buried oxide, metal studs are fabricated to facilitate interconnection between the mother and daughter chips.

Advantageously, the present methods do not need the chips to be transferred from a temporary carrier to a permanent carrier, which reduces the cost. In accordance with this disclosure, by employing through via connections and cavity formation, sub-chips (daughter chips) can be directly diced out of a wafer and mounted on the backside of the mother chip. The method further avoids the use of vertical stacking in a 3-D package to facilitate heat dissipation. In addition, multiple chips manufactured in different technologies can be integrated on the same package.

The double-sided package protocol adopts two-dimensional chip packaging schemes on both sides of the wafer. In the thin silicon layer on the front side of the SOI wafer, mother chips such as central processing units and serializer/deserializer (SerDes) chips are fabricated. The performance of these chips is boosted by the floating body effect as well as low junction capacitance.

The floating body effect is an inherent characteristic of SOI MOSFETs. Since the potential of the body is not fixed, the holes that are injected into the body cause the potential in the body to rise, resulting in lower threshold voltage, higher drain current and faster gate. The buried oxide layer also eliminates the area junction capacitance between the source/drain diffusion and the substrate, which allows the transistor to operate faster with less capacitance to charge and discharge. With secondary components placed on the backside of the wafer, the mother chips will have smaller dimensions and higher yield than equivalent system-on-chip (SoC) designs.

The remaining area on the front side of the SOI wafer can be used to form decoupling capacitors and other discrete devices. The backside of the SOI wafer may have thicker material that can be thinned down before etching to form the cavities for the daughter chips. The daughter chips that can be embedded in the cavities may include high-speed radio frequency (RF) input/output (I/O) chips, memory chips such as non-volatile random access memory (NVRAM), magnetic RAM (MRAM), ferroelectric RAM (FRAM), and embedded dynamic RAM (eDRAM) whose deep trench capacitor process is not fully compatible with conventional CMOS processes, decoupling capacitors, high-Q semiconductor inductors, and micro-electromechanical systems (MEMS).

The present invention may form deep vias from the pads of the mother chips on the front side of the SOI wafer, through the buried oxide layer, to the pads of the daughter chips on the backside of the SOI wafer. These through vias not only provide the power supplies, signals and controls, but also enable the communication, testing, and monitoring of the mother and daughter chips. To fabricate the through vias, no devices or interconnects should be formed underneath the designated pads of the mother chip. Since the total thickness of the top silicon layer and the buried oxide layer is within a few hundred microns, the size of these through vias can be much smaller than a traditional multi-chip package.

It is to be understood that the present invention will be described in terms of a given illustrative architecture having a SOI wafer; however, other architectures, structures, substrate materials and process features and steps may be varied within the scope and spirit of the present invention.

The circuit as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections) In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now in detail to the figures in which like numerals represent the same or similar elements and initially to FIG. 1, a silicon-on-insulator (SOI) wafer 10 with a top silicon layer 43, a buried dielectric (e.g., oxide) layer 42, and a bottom substrate 40 (e.g., silicon) are illustratively shown. An integrated circuit system 11 includes active devices 44, metal interconnects 45, and discrete devices 48 formed on the silicon wafer 10. The buried oxide layer 42 on SOI wafer 10 may include a thickness of say, 5 micrometers or less.

Figure 2:
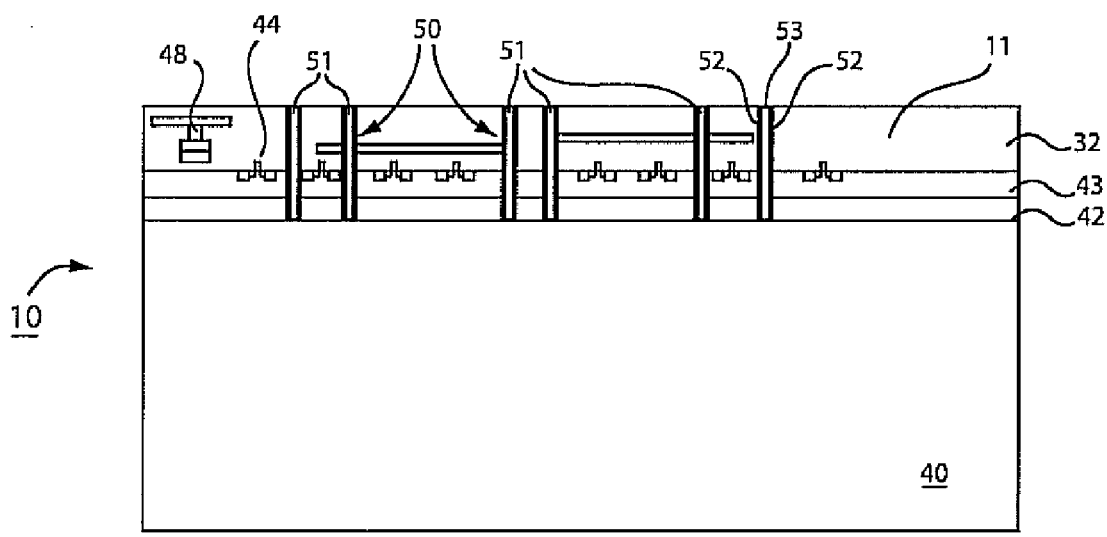
FIG. 2 is a cross-sectional view showing through vias etched, dielectric liners formed and filled with a conductive material in accordance with one embodiment of the present invention.

Referring to FIG. 2, trenches 50 may be formed. In one embodiment, high-density plasma reactive ion etching (RIE) can be used to create trenches 50 down to the silicon substrate 40 through layers 32, 42 and 43 for forming through vias 51, which permit other chips to be mounted on the backside of the water 10, and will be described herein.

Through vias 51 are formed through a top silicon layer 43 after lithographic patterning, etching, sidewall dielectric coating 52, and metal or conductive filling 53. In one embodiment, the ratio of via depth to via size (e.g., trench width) may range from between about 1 to about 5. To etch a back end of line (BEOL) insulating material 32, the silicon layer 43, and the buried oxide layer 42, respectively, $CF_4$, $Cl_2$ and/or $CF_4$ based plasma etching may be employed successively, with a proper end-point detection method. Such detection methods are known in the art.

To ensure that vias 51 are extended below the buried oxide layer 42, it may be necessary to over-etch the buried oxide layer 42. Insulating materials 52, such as the oxide/nitride sidewall spacers, are preferably employed to prevent the vias 51 from being shorted to any adjacent conductive layers, well regions, or the substrate layer. The vias 51 can then be filled with conductive metal 53, such as copper, tungsten, aluminum, doped polycrystalline material, alloys and/or any other conductive material. A conformal chemical vapor deposition (CVD) deep-etch technique can be used to eliminate any void formation inside the vias 51 during the filling process.

Figure 3:
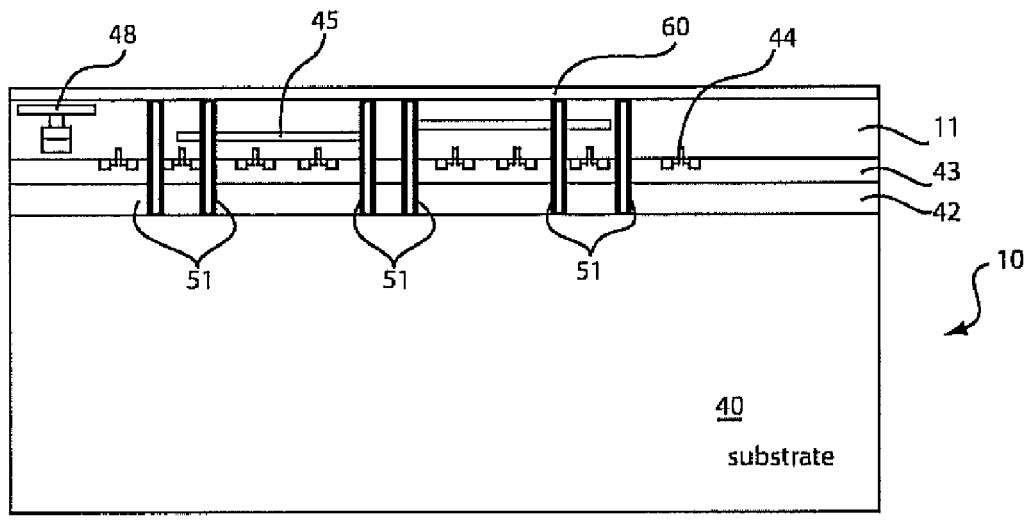
FIG. 3 is a cross-sectional view showing a protective coating formed on a first side of the wafer in accordance with the present invention.

Referring to FIG. 3, a layer of protective coating 60 such as oxide, nitride, oxy-nitride, or glass is formed on a top surface of the wafer 10 to protect it from being damaged during the backside processing. Other materials or protection schemes may also be employed.

Figure 4:
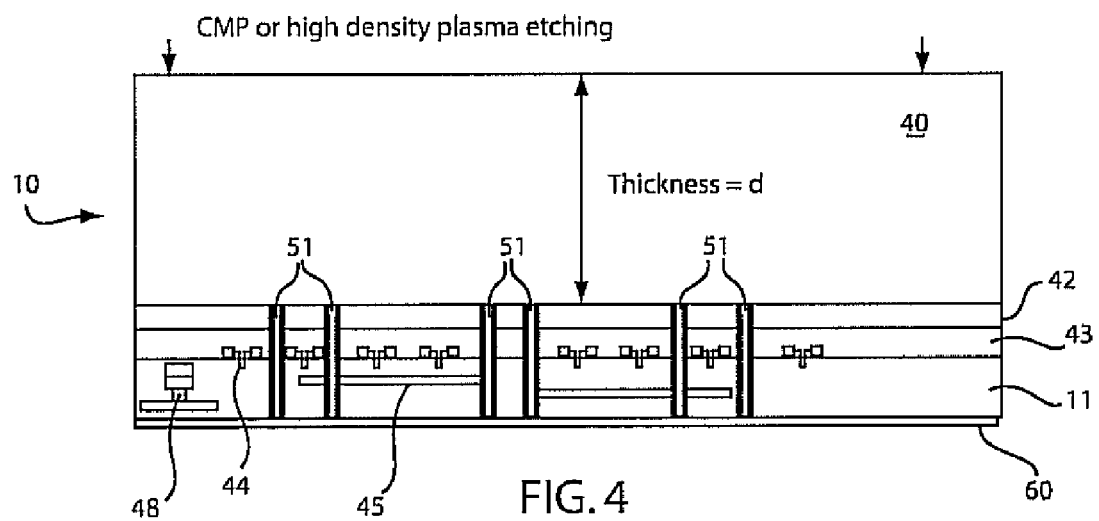
FIG. 4 is a cross-sectional view showing polishing/etching of a silicon substrate portion of the wafer in preparation for etching in accordance with the present invention.

Referring to FIG. 4, the silicon substrate 40 on the backside of the wafer is thinned, by for example, chemical-mechanical polishing (CMP) or high-density plasma etching (e.g., RIE) to a proper thickness "d". It is preferable that "d" may be a few microns thicker than the thickest chip to be mounted on the backside.

Figure 5:
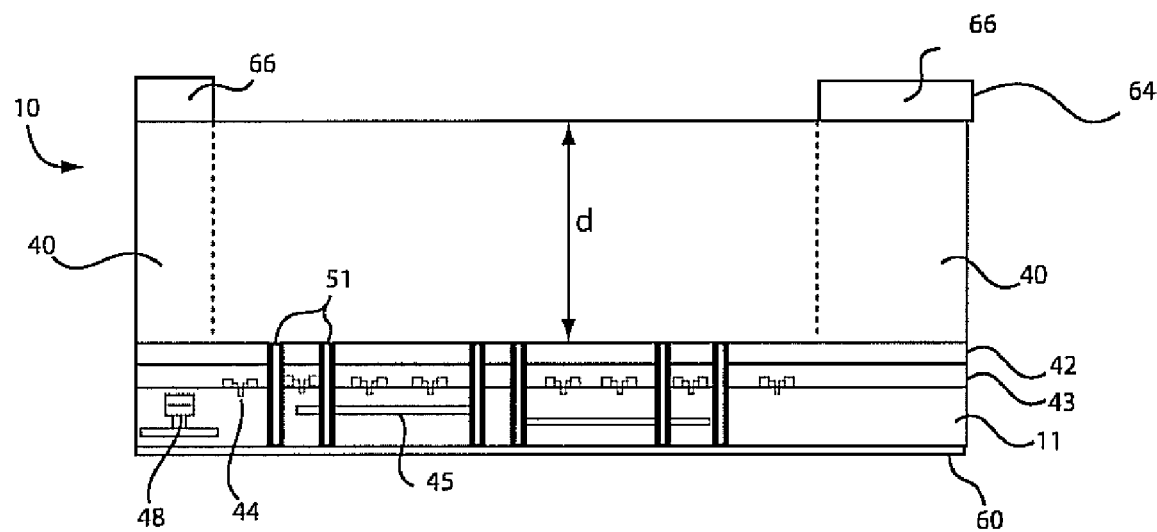
FIG. 5 is a cross-sectional view showing silicon substrate (backside) photolithography patterning in accordance with the present invention.
Figure 6:
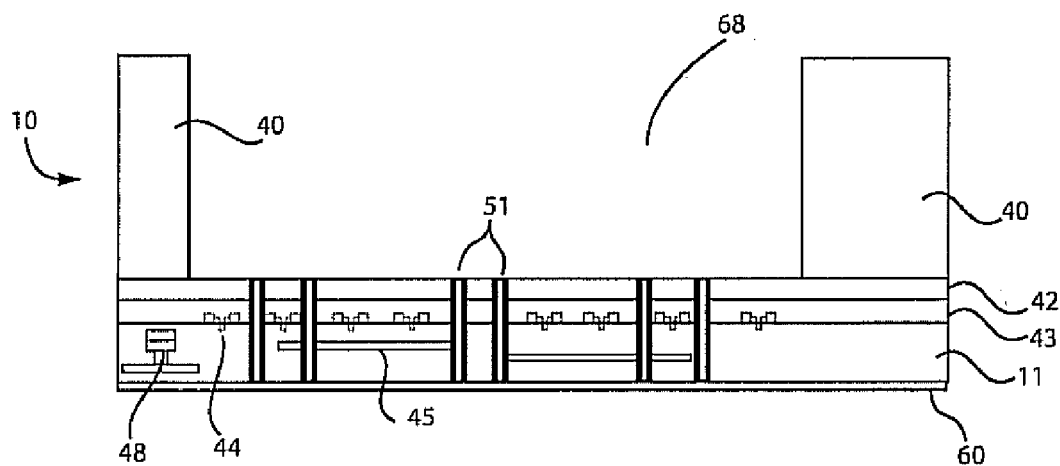
FIG. 6 is a cross-sectional view showing backside etching to form a cavity in accordance with the present invention.

Referring to FIGS. 5 and 6, a photolithography pattern 64 is generated by applying a photoresist 66 and patterning the resist 66 using known methods. Resist 66 is then employed as a mask in an etching process to form a backside cavity or cavities 68. The size of the cavity 68 should be slightly larger than the chip to be mounted inside (below the open surface) and margins should be provided in case of misalignment. Multiple chips may be placed inside the same cavity 68.

The cavities 68 are formed after etching and the conductive material 53 of through vias 51 is exposed at the surface of the buried oxide layer 42. The resist 66 is removed from substrate 40.

Figure 7:
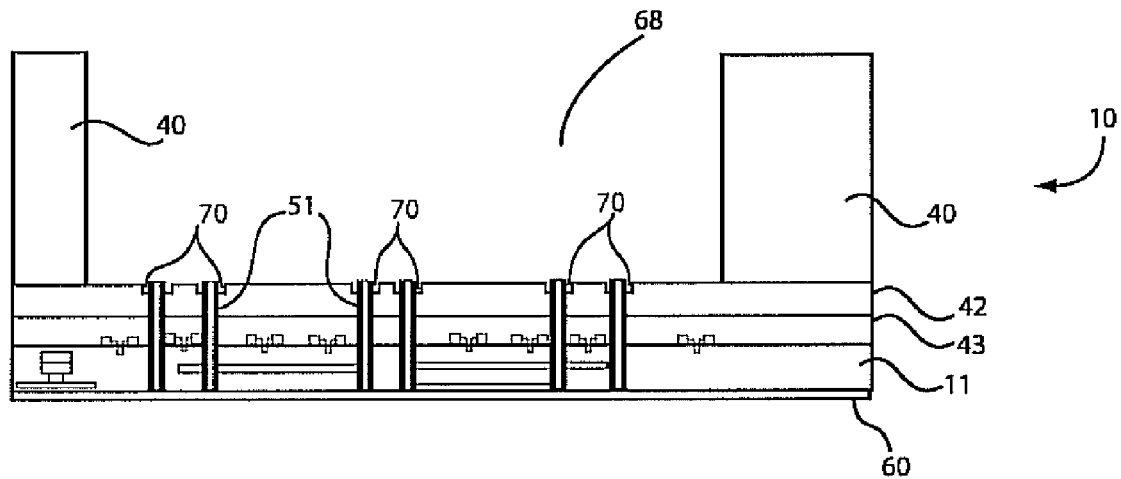
FIG. 7 is a cross-sectional view showing pockets opened around through vias within the cavity in accordance with the present invention.

Referring to FIG. 7, an extra etching step may be employed to open a pocket 70 on top of each via 51 by thin photoresist patterning and exposure at the surface of the buried oxide 42. The pocket 70 formation is preferable during the ensuing bonding and soldering reflow steps, to provide the space for solder to flow and thus form better contacts.

Figure 8:
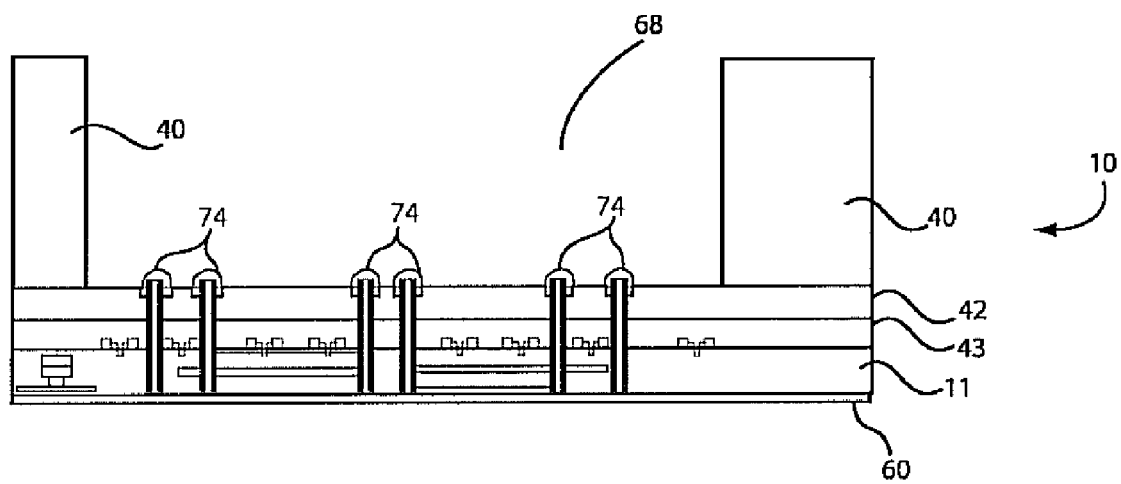
FIG. 8 is a cross-sectional view showing selective deposition of solder on through vias in accordance with the present invention.

Referring to FIG. 8, a selective plating process may be employed to form solder balls 74 on exposed studs 53 in vias 51 and inside the pockets 70. The process selectively forms metal on studs 53. Low melting-temperature material is preferable in forming the solder balls 74. Solder balls 74 may include tin or lead alloys and may employ a process similar to a controlled collapse chip connection (C4) bonding method.

Figure 9:
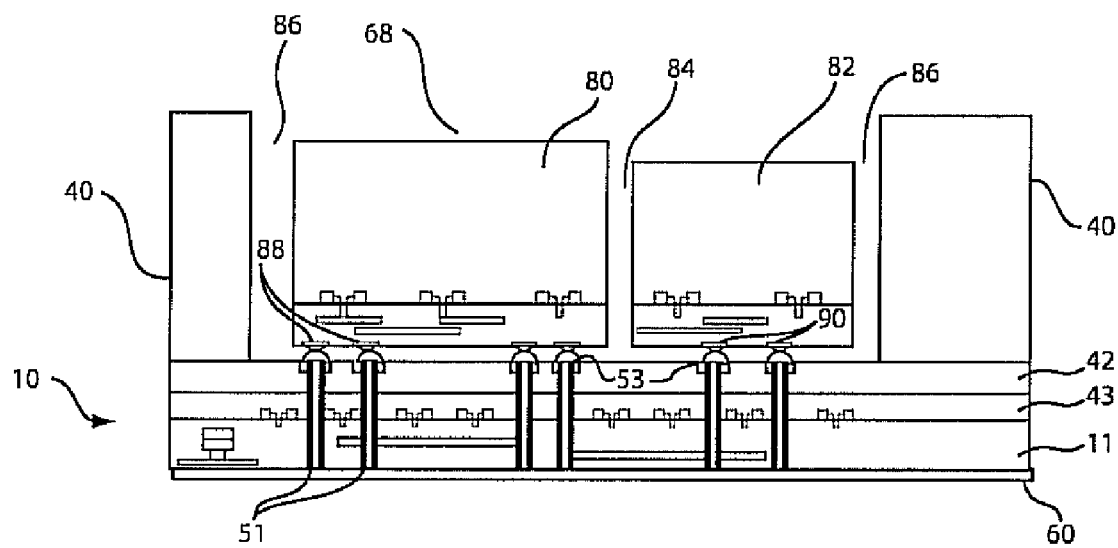
FIG. 9 is a cross-sectional view showing the placement of sub-chips into the backside cavity and aligning the sub-chips with the through vias in accordance with the present invention.

Referring to FIG. 9, chips (sub-chips) 80 and 82 are illustratively shown making contact with studs 53 of vias 51. Chips 80 and 82 may include thinned chips (referred to earlier as daughter chips), which are flipped upside down, placed inside the cavity 68, and bonded to the mother chip (wafer 10). The depth (d) of the cavities 68 is preferably deeper than the thickness of all the daughter chips (80 and 82). Chips 80 and 82 may be formed in a separate processing step and may themselves include a cavity therein with even smaller sub-chips connected thereto in accordance with the present invention.

Chips 80 and 82 may be placed in cavity 68 having gaps 84 therebetween and between walls 86 and chips 80 and 82. Alternately, chips 80 and 82 may include spacers or layers of material to ensure a proper fit and automatically align studs 53 with contacts 88 and 90 of each chip 80 and 82. These chips 80 and 82 may also be aligned using tooling or other gapping methods. In one embodiment, chips 80 and 82 are connected or attached to one another prior to placing them into cavity 68.

A bonding process may include a temperature of about 400° C. to be carried out to join solder balls for contacts 88 and 90 of the daughter chips 80 and 82 with the solder balls 74 for through vias 51 for the mother chip 10.

Figure 10:
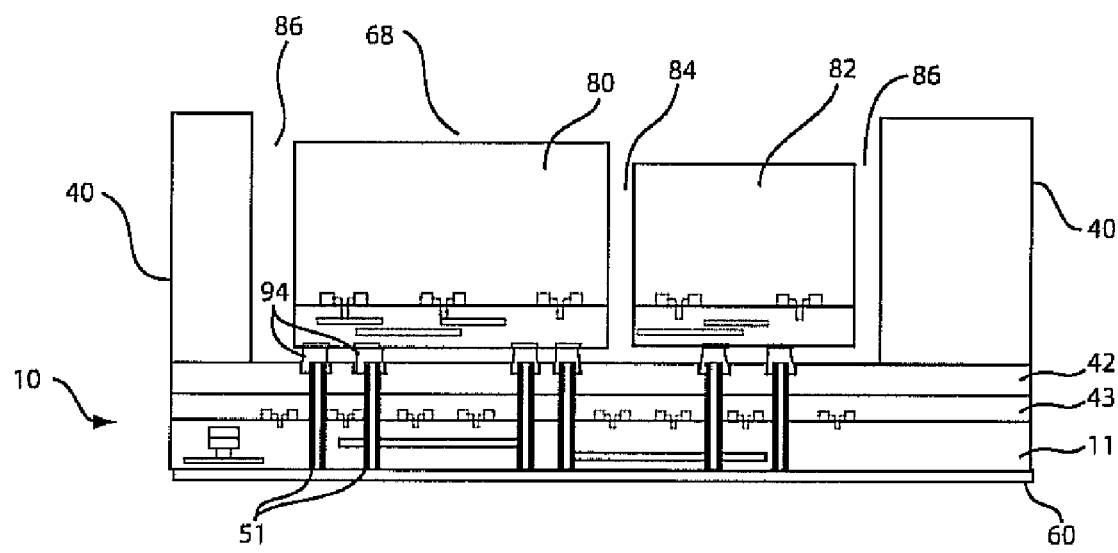
FIG. 10 is a cross-sectional view showing soldering and bonding of the sub-chips to the through vias to permit the sub-chips and components of the original to coact to perform a function in accordance with the present invention.

Referring to FIG. 10, collection of excessive bonding material 94 is shown inside the pocket areas 70. Chips 80 and 82 are now bonded to vias 51.

Figure 11:
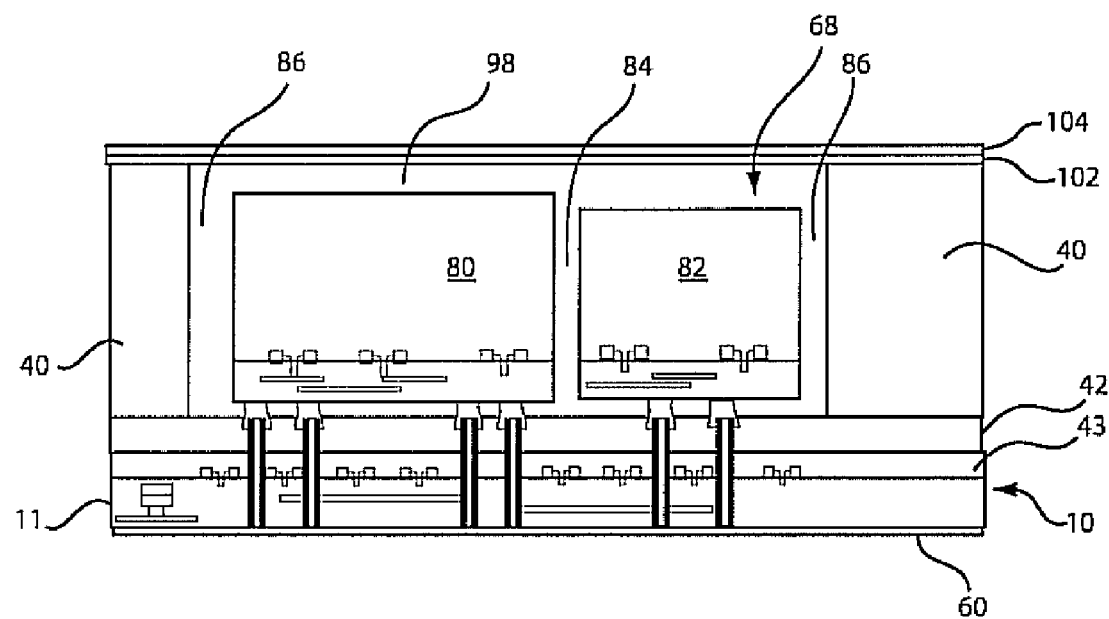
FIG. 11 is a cross-sectional view showing a thermally conductive underfill and deposition of a thermally conductive layer in accordance with the present invention.

Referring to FIG. 11, an under-fill process is employed to fill the gaps 84 and 86 and any other locations between chips 80 and 82 and wafer 10 with a thermally conductive agent 98, such as a thermal paste, or standard filling polymer or other fillers. It is preferred that the agent 98 be thermally conductive to promote heat dissipation, but act as an electrical insulator. The top surface of the cavity 68 may further be filled with a more thermally conductive material 102 such as, for example, chemical vapor deposited (CVD) diamond. A metal film 104 may also be formed on the backside of wafer 10 to seal the daughter chips inside the cavities 68.

Figure 12:
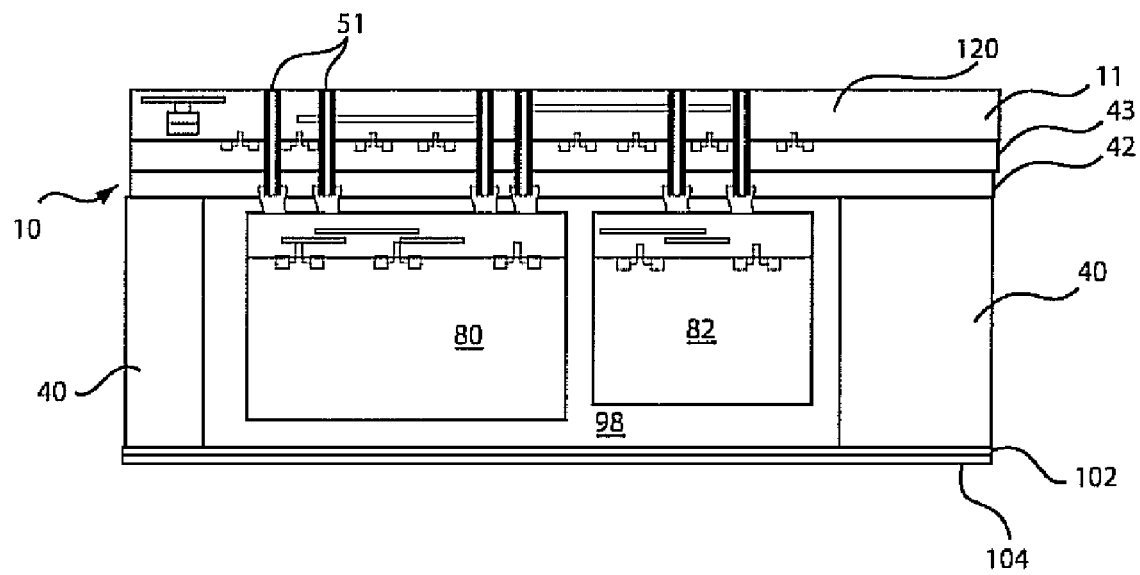
FIG. 12 is a cross-sectional view showing the protective coating being removed from the front side of the wafer in accordance with the present invention.

Referring to FIG. 12, after the daughter chips 80 and 82 are mounted on the backside, the top protective layer 60 of a mother chip 120 (on wafer 10) can be stripped. This may be in preparation for further processing on the system such as global or local interconnects and vias, attaching other components or forming additional layers or features, etc.

Figure 13:
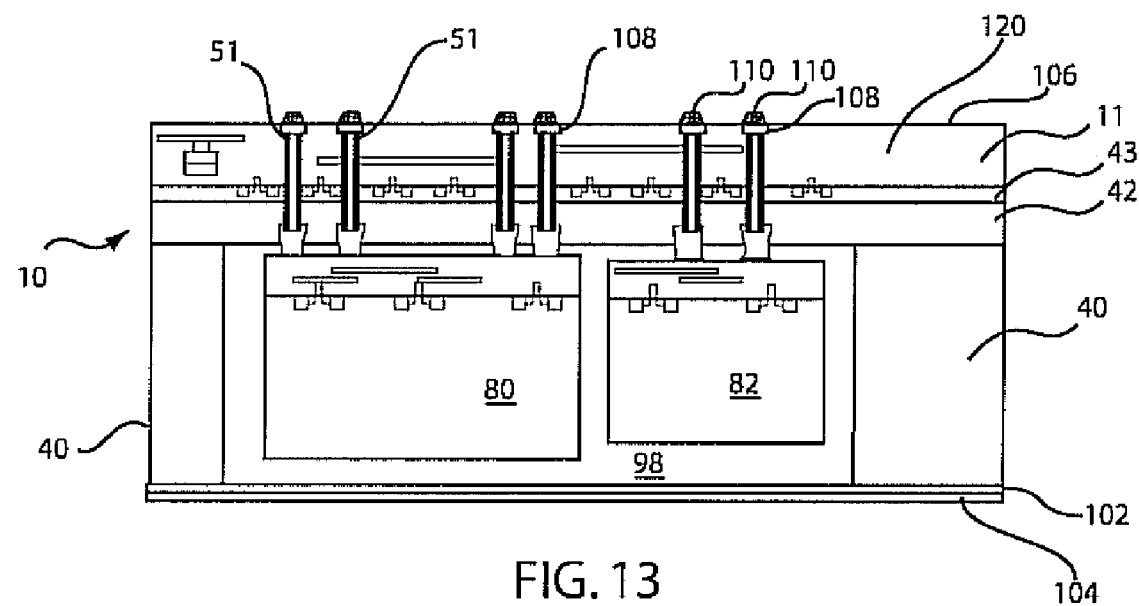
FIG. 13 is a cross-sectional view showing front side global interconnect formation and C4 formation in accordance with the present invention.

Referring to FIG. 13, more metal layers 106, contact pads 108, and C4 balls 110 can be formed on the front side of the wafer 10 of mother chip 120. Further processing may be performed to form additional structures or to provide packaging for system 100.

A final double-side chip assembly 100 can be cut from the wafer 10 (e.g., dicing the wafer to form chip packages), where each assembly has a mother chip 120 on the front side and a plurality of daughter chips (e.g., 80 and 82) mounted on the backside. The buried oxide layer 42 of the SOI wafer 10 is used as the holding plate for through via interconnection between the mother chip 120 and daughter chips 80 and 82.

Figure 14:
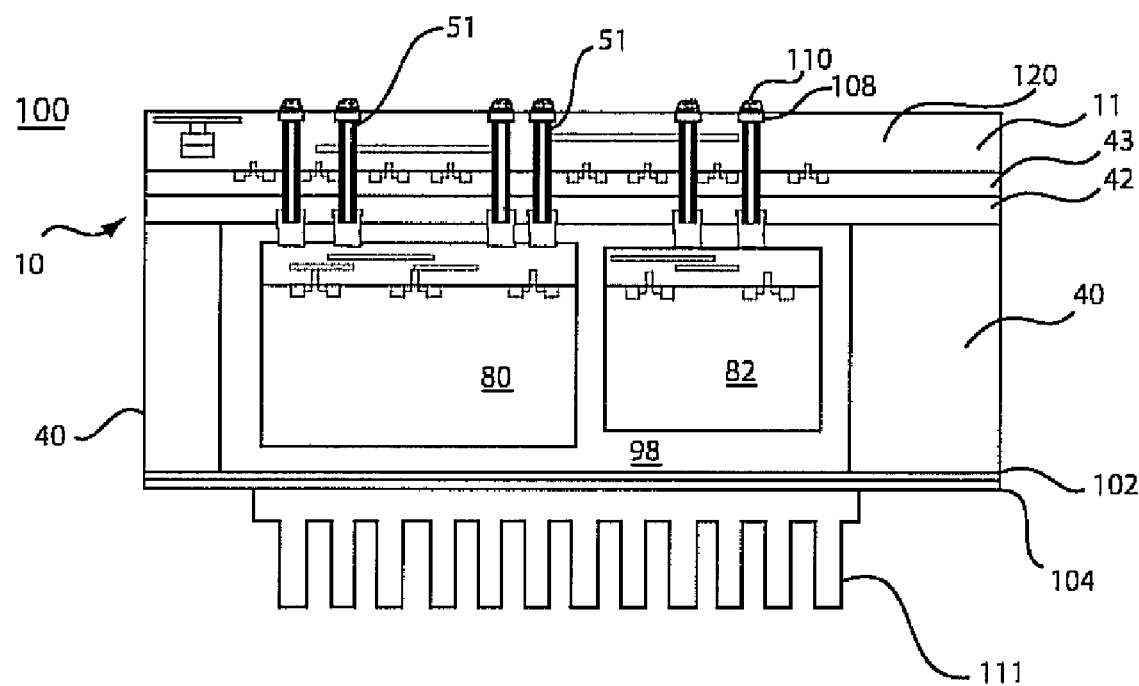
FIG. 14 is a cross-sectional view showing the formation of a backside heat sink in accordance with the present invention.

A heat sink 111 can be mounted on the backside of the chip as illustratively shown in FIG. 14. Heat sink 111 may be attached, e.g., using a thermal adhesive material, or may be formed be depositing materials and etching the material into a predetermined shape (e.g., fins and troughs).

Figure 15:
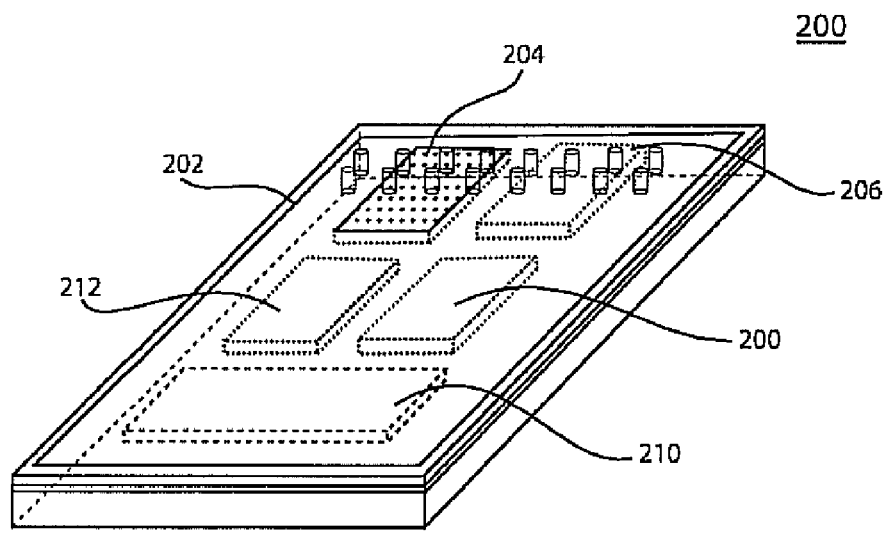
FIG. 15 is a perspective view showing a plurality of sub-chips placed and connected by through vias to a mother chip in accordance with one embodiment of the present invention.

Referring to FIG. 15, a SOI wafer scale package 200 includes one mother chip 202, such as a processor (or memory device or combination thereof) formed on a top silicon layer (e.g., 43 of FIG. 1) to achieve high performance, and several daughter chips 204, 206, 208, 210 and 212. These chips may include for example, SRAM cache, eDRAM, NVRAM, FPGA, and high-speed RF interface chips mounted on the backside of the assembly 200. Through via connections 251 are illustratively shown in one area between the mother chip 202 and daughter chips 204-212. Vias and the chip placement and alignment need to be performed after appropriate planning. It is preferably that the mother and daughter chips be co-designed for the package 200 to ensure coaction, proper alignment/placement and proper functioning.

Figure 16:
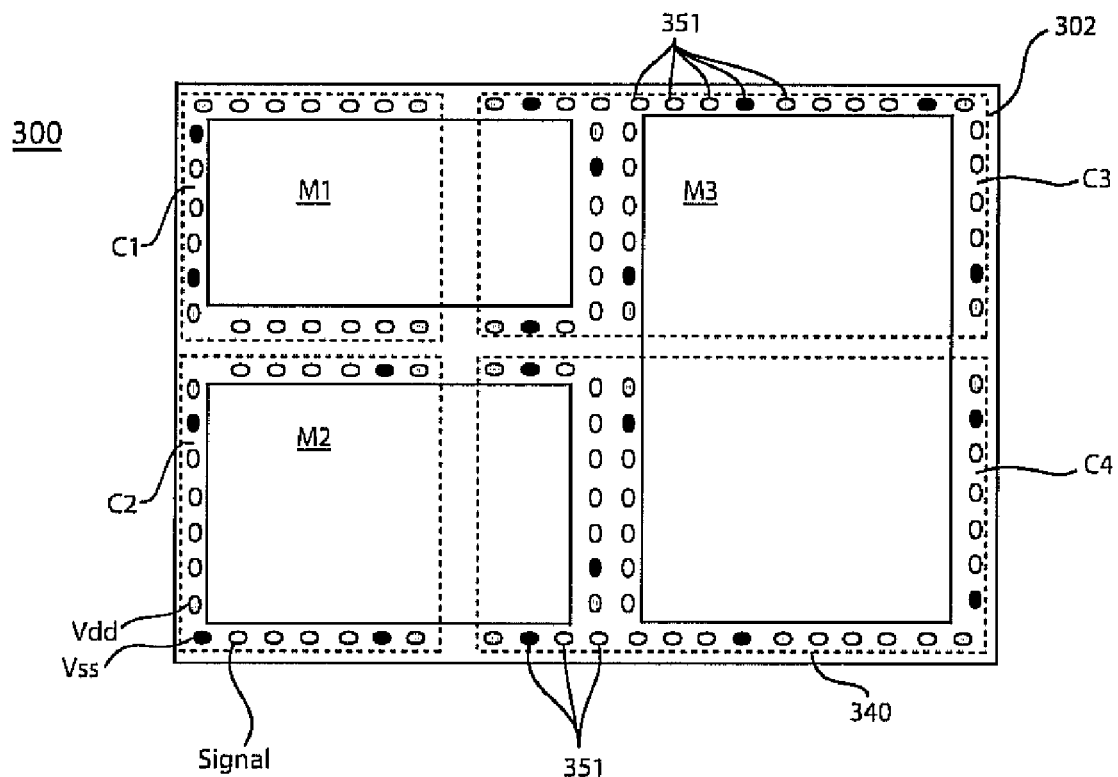
FIG. 16 is a top schematic view of a mother chip with daughter (sub-chips) placed therein showing through via placement and function in accordance with one embodiment of the present invention.

Referring to FIG. 16, one example of a package 300 where the mother chip 302 includes 3 macros M1, M2, and M3 (sub-chips). Package 300 indicates aspects to be considered during co-design of mother and daughter chips in a system. In this embodiment, through via connections 351 are only permitted in the empty space between the adjacent macros (M1, M2, M3) and edges of the mother chips' substrate 340. Through vias 351 may be designated for different tasks, such as carrying power Vdd, or Vss or signals (Signal) as illustratively indicated in FIG. 16. In an alternate embodiment, mother chip 302 may be comprised of multiple chips C1, C2, C3 and C4 and connected using macros, structures or sub-chips.

In one embodiment, deep vias are not needed from pads of mother chips on a front side of the SOI wafer, through the buried oxide layer, to the pads of daughter chips on the backside of the SOI wafer. Instead, vertical optical links (VOI) are provided between mother and the all the daughter chips. While, electrical interconnects are provided between a mother chip and the outside world. Another embodiment provides optical interconnects between children chips and the mother chip as well as between the mother chip and the outside world. In yet another embodiment, optical interconnects are provided between children chips and the mother chip, while providing both optical and electrical interconnect between mother chip and outside world. In yet another embodiment, both optical and electrical interconnects are employed everywhere through out a system. The terms subchip, daughter chip and child or children chips will be used interchangeable throughout the specification and claims.

Figure 17:
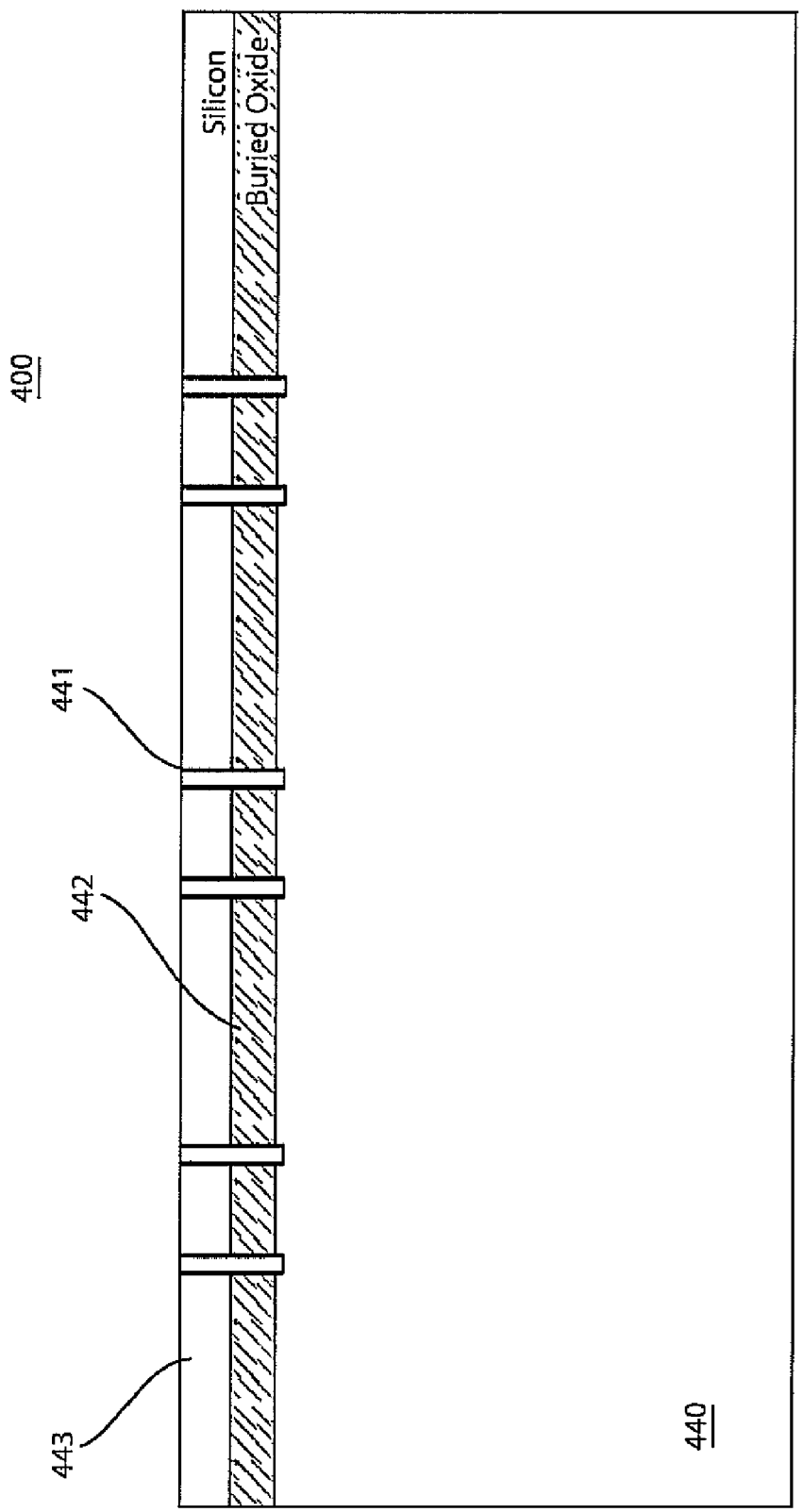
FIG. 17 is a cross-sectional view showing optical through vias formed in a silicon-on-insulator structure/wafer.
Figure 18:
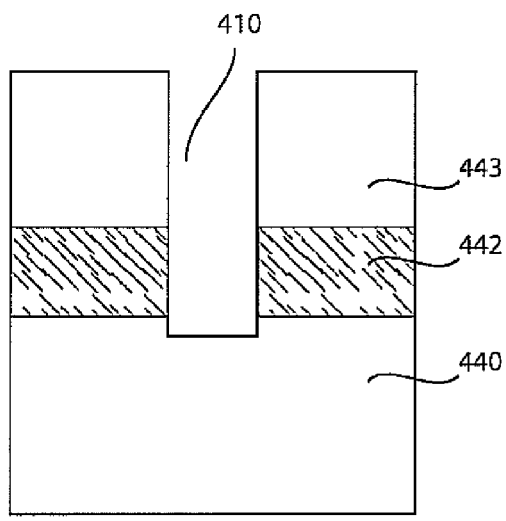
Figure 19:
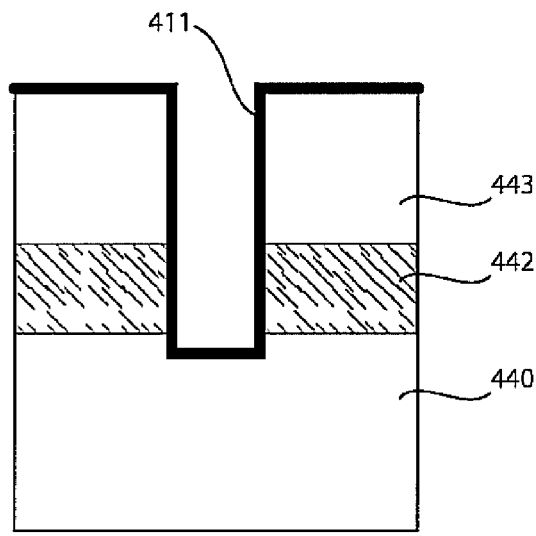
FIG. 19 is a cross-sectional view showing a cladding layer formed in the via hole of FIG. 18.
Figure 20:
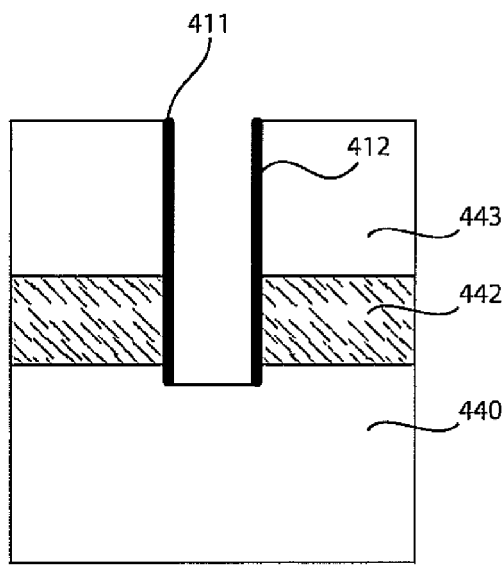
FIG. 20 is a cross-sectional view showing the cladding layer removed from a bottom of the via hole of FIG. 19.
Figure 21:
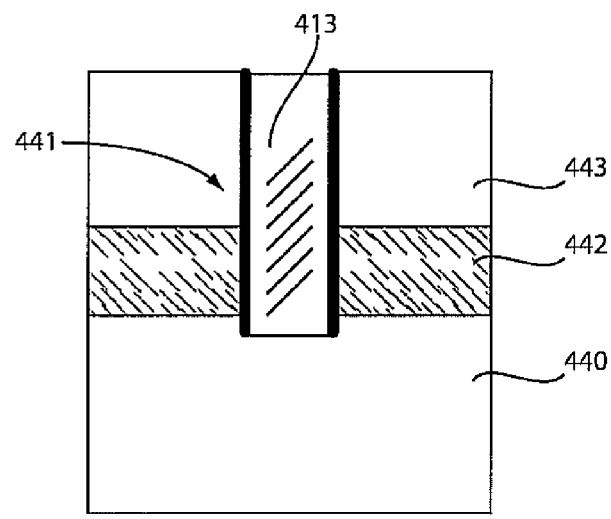
FIG. 21 is a cross-sectional view showing the via hole filled with an optical material.

Referring to FIG. 17, a silicon-on-insulator (SOI) wafer 400 with a top silicon layer 443, a buried dielectric (e.g., oxide) layer 442, and a bottom substrate 440 (e.g., silicon) are illustratively shown. The buried oxide layer 442 on SOI wafer 440 may include a thickness of say, 5 micrometers or less. Vertical optical interconnects 441 (VOI) are formed through silicon 443 and buried oxide 442.

Processing to form vertical optical interconnects (or VOI) is illustratively shown in FIGS. 18-21. Referring to FIGS. 18-21, a via 410 is formed by lithographic patterning and a two-step etching process. A first step is to etch through a top silicon layer 443 using, e.g., $Cl_2$ based plasma. In a second etching step, the buried oxide 442 is etched using $CF_4$ based plasma. A slight over etch is preferable to guarantee that the via bottom reaches to the substrate layer of the SOI wafer 440.

A clad layer 411 is deposited, for example a fluororesin material, can be used to form a layer on the surface of the etched via 410. A sidewall formation etching is carried out using $O_2$ plasma etching to leave the clad layer 411 on sidewalls 412 of the via 410. The via 410 is filled with a core material 413 such as polymethyl methacrylate (PMMA) having higher refractive index than that of the clad layer 411. Core material 413 has an ability to transmit light therethrough to permit optical communications. The excessive material on the top surface is removed by an etch-back process.

Figure 22:
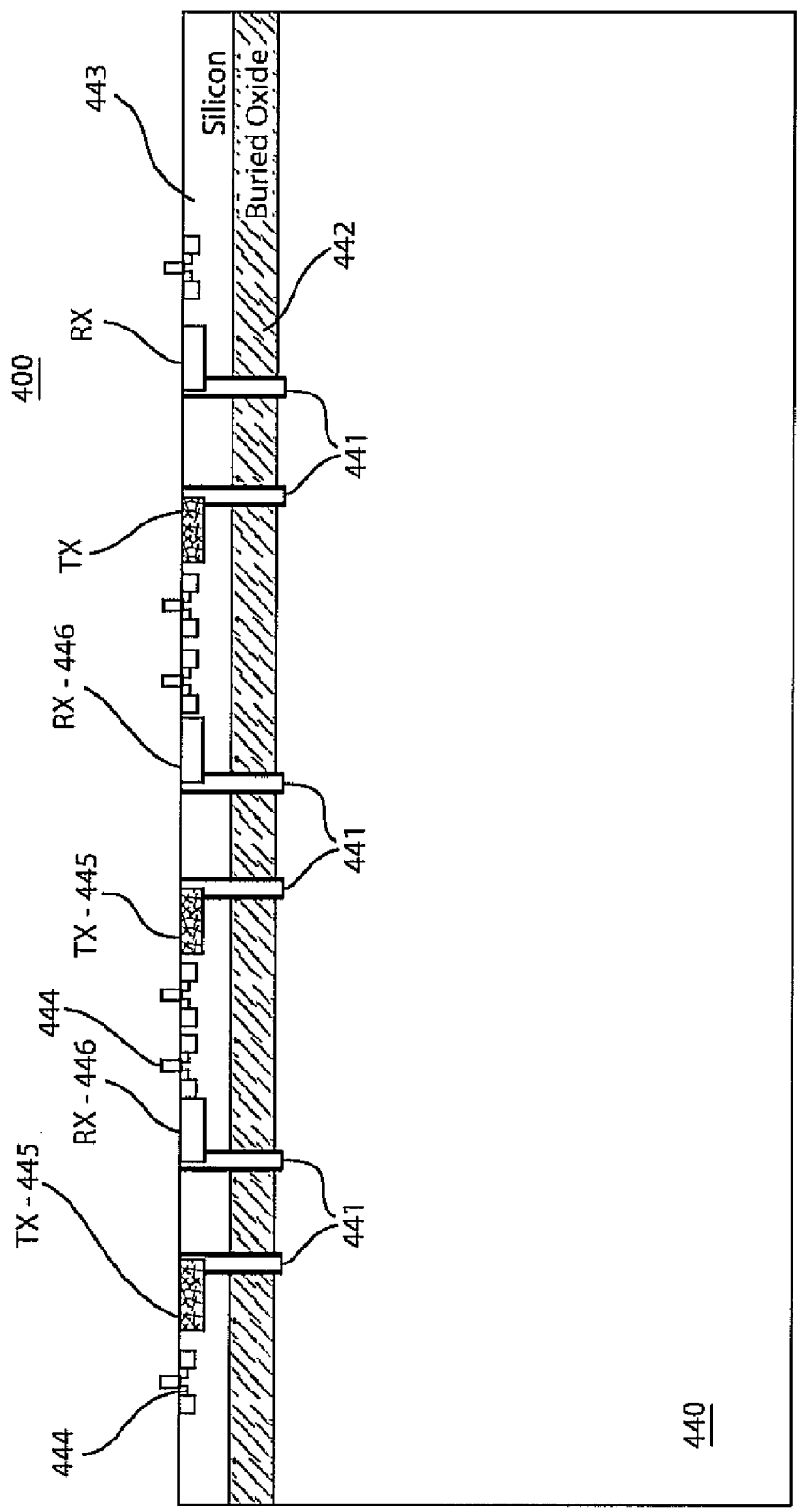
FIG. 22 is a cross-sectional view showing components and devices including transmitters and receivers formed on a silicon layer.

Referring to FIG. 22, an integrated circuit system 400 comprising active devices 444, light emitting devices (transmitters, TX) 445 such as laser diodes TX and light receiving (receivers, RX) devices (446) such as photo diodes RX are formed on the silicon 443. The light receiving device RX 446 receives photons transmitted through the vertical optical interconnect (or VOI) 441 (e.g., from children chips (not yet formed). Device 446 converts photons into electrons, and the light transmitting device TX 445 converts electrons into photons and transmits photons using the VOI 441 to the children chips, which will be shown and described hereinafter. TX 445 and RX 446 are aligned to the corresponding VOIs 441. The buried oxide layer 442 on an SOI wafer may have a thickness of 5 micrometers or less. High-density plasma reactive ion etching (RIE) can be used to create cavities in the silicon substrate 440 and allow other chips to be mounted on the backside of the wafer 400.

Figure 23:
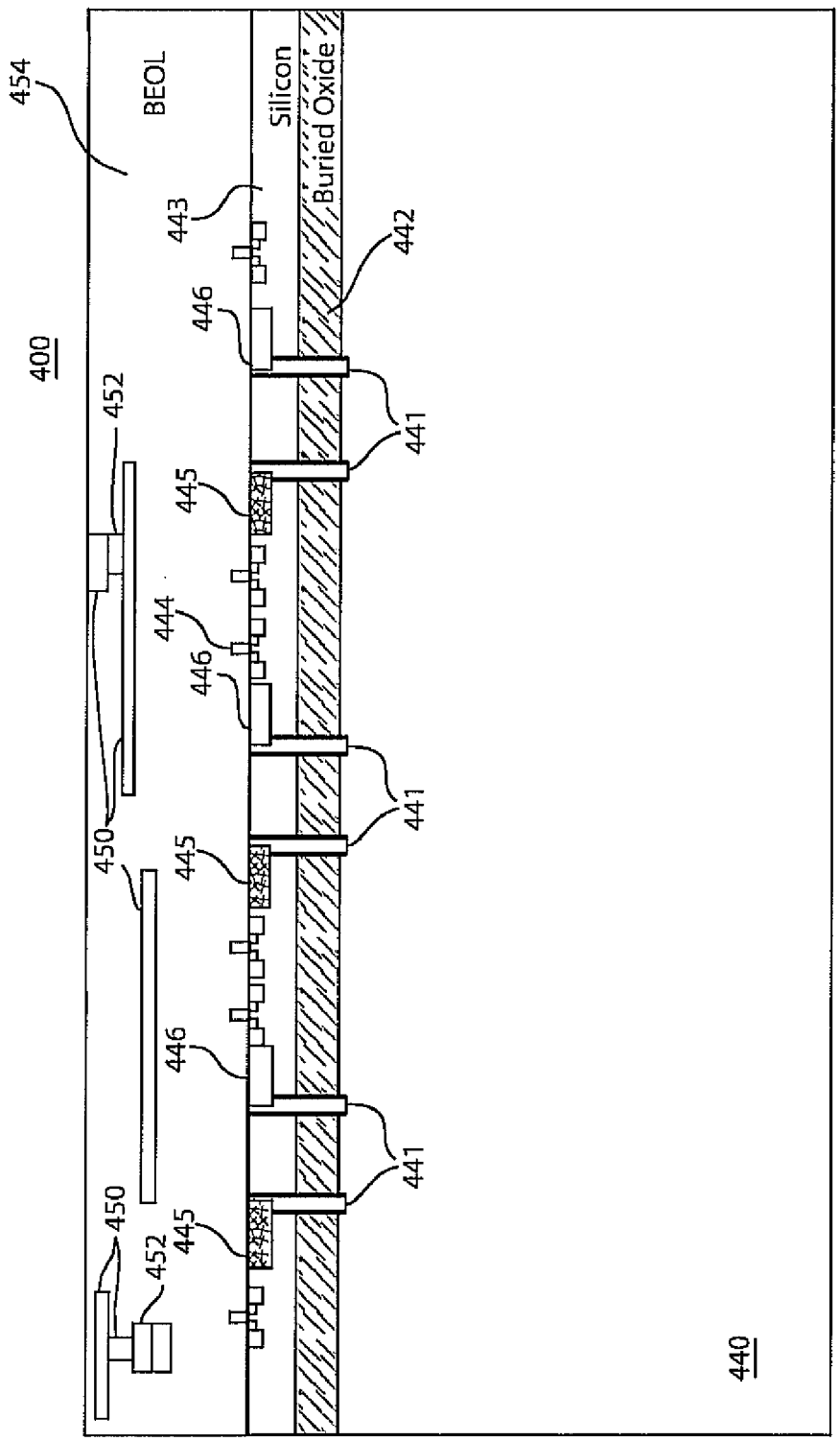
FIG. 23 is a cross-sectional view showing a back-end-of line layer having discrete components and metal lines therein.

Referring to FIG. 23, multi-level conductive (metal) interconnects 450 of the mother chip (400) are formed. In addition, discrete devices 452 such as capacitors, resistors and other devices can all be formed in a back-end-of-the-line (or BOEL) layer 454.

Figure 24:
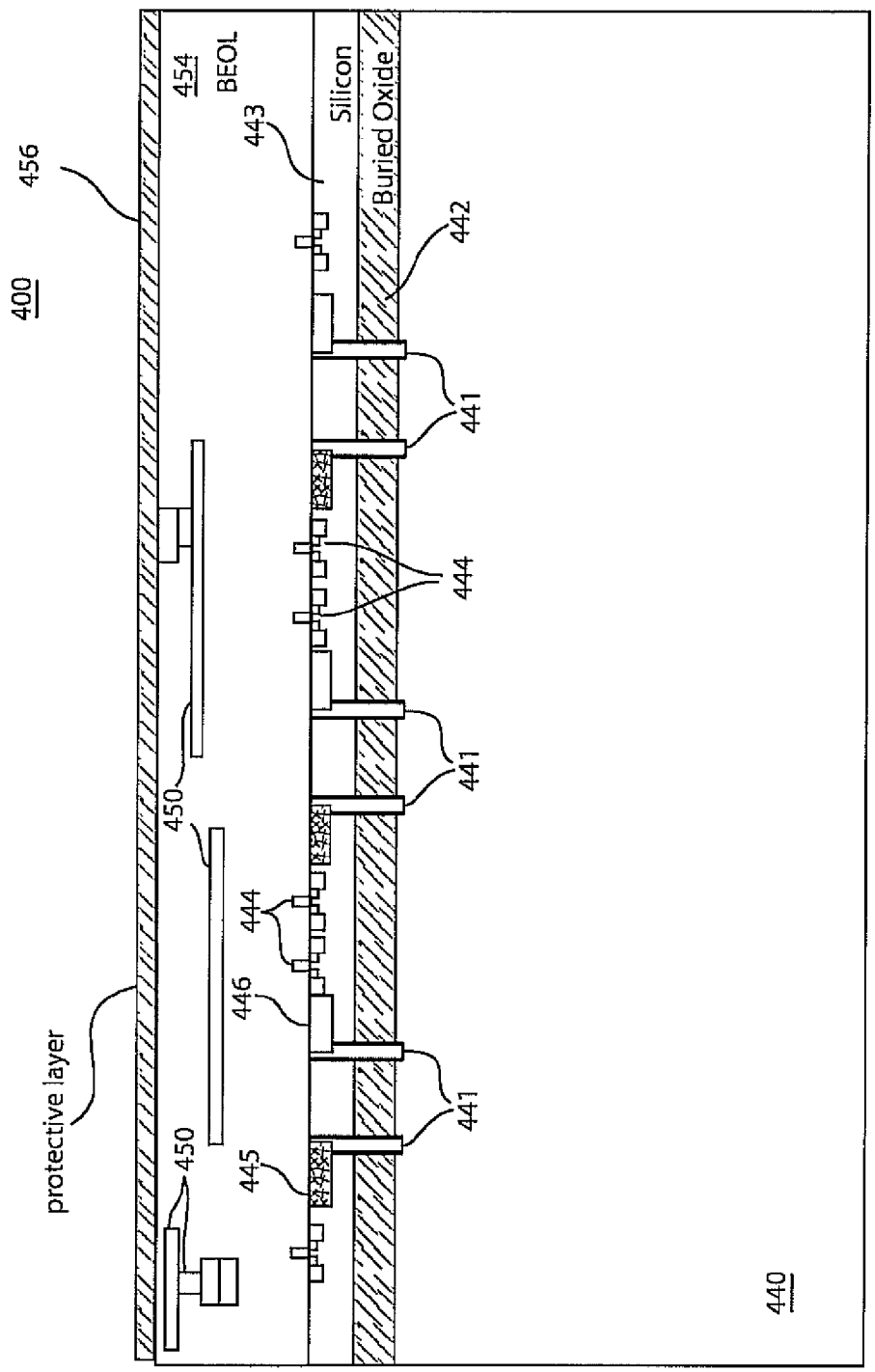
FIG. 24 is a cross-sectional view showing a protective coating formed on a first side of the wafer.

Referring to FIG. 24, when the mother chip processing is completed a layer 456 of protective coating such as oxide, nitride, oxy-nitride, or glass is preferably formed on the top surface of the wafer 400 to protect the surface from being damaged during the back-side process.

Figure 25:
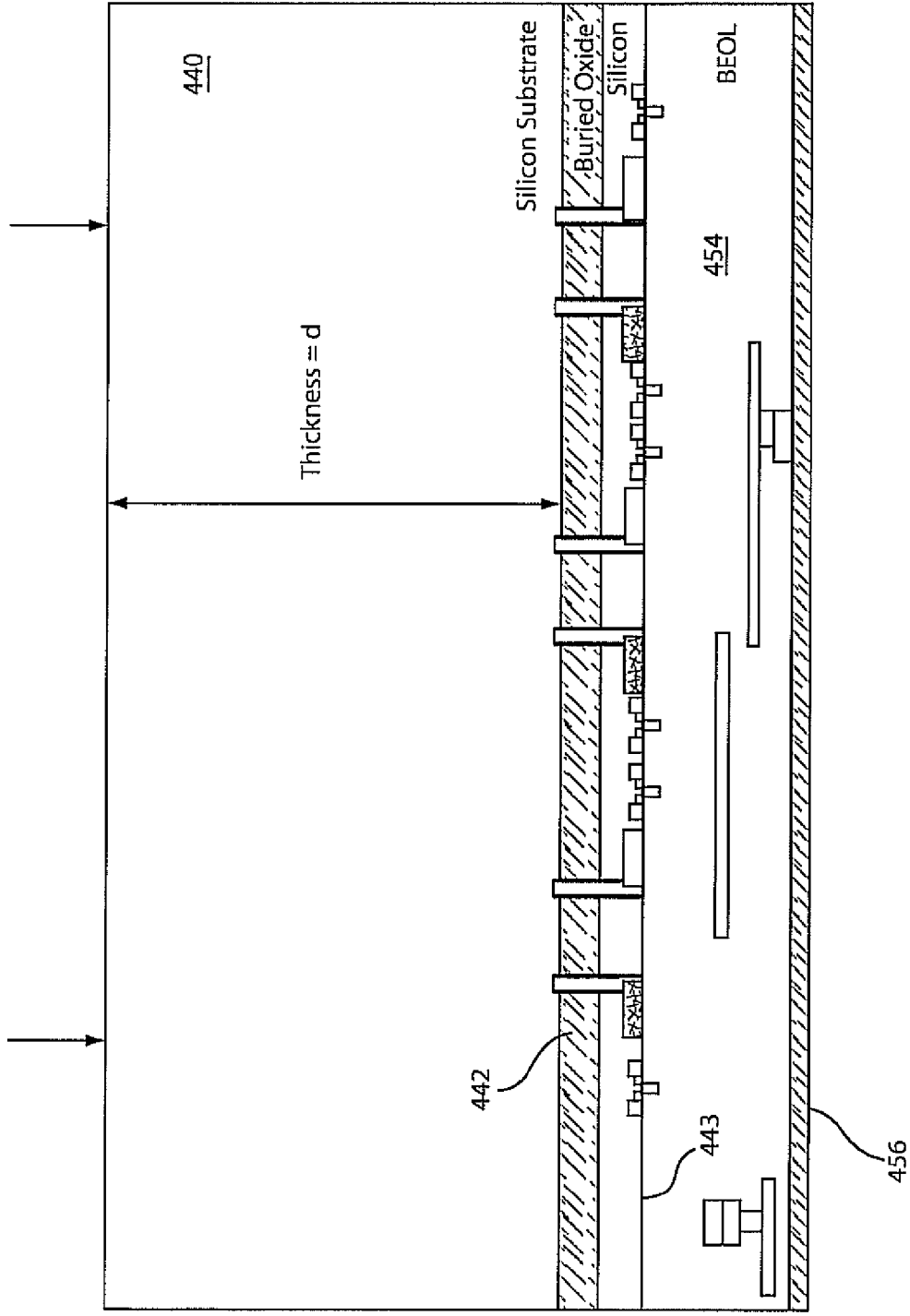
FIG. 25 is a cross-sectional view showing polishing/etching of a silicon substrate portion of the wafer in preparation for etching.

Referring to FIG. 25, the silicon substrate 440 on the backside of the wafer 400 is thinned by chemical-mechanical polishing (CMP) or high-density plasma etching to a proper thickness "d", which may be a few microns thicker than the thickest chip to be mounted on the backside.

Figure 26:
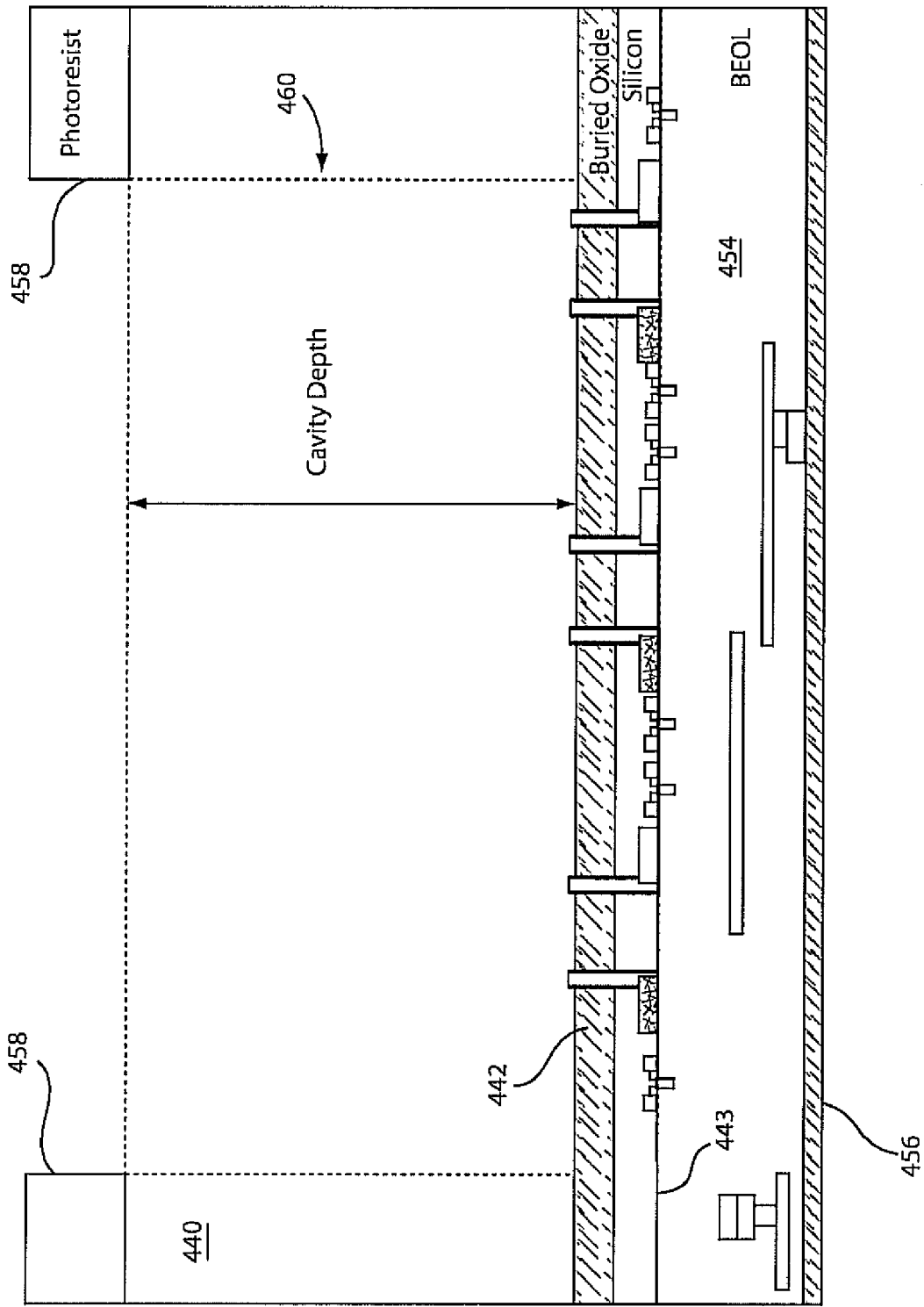
FIG. 26 is a cross-sectional view showing silicon substrate (backside) photolithography patterning.

Referring to FIG. 26, a photolithography pattern 458 is generated to form backside cavities 460. The size of the cavity should be slightly larger than the chip to be mounted inside and margins need to be provided in case of misalignment. Multiple chips are permitted to be placed inside a same cavity 460, which is to be formed by etching.

Figure 27:
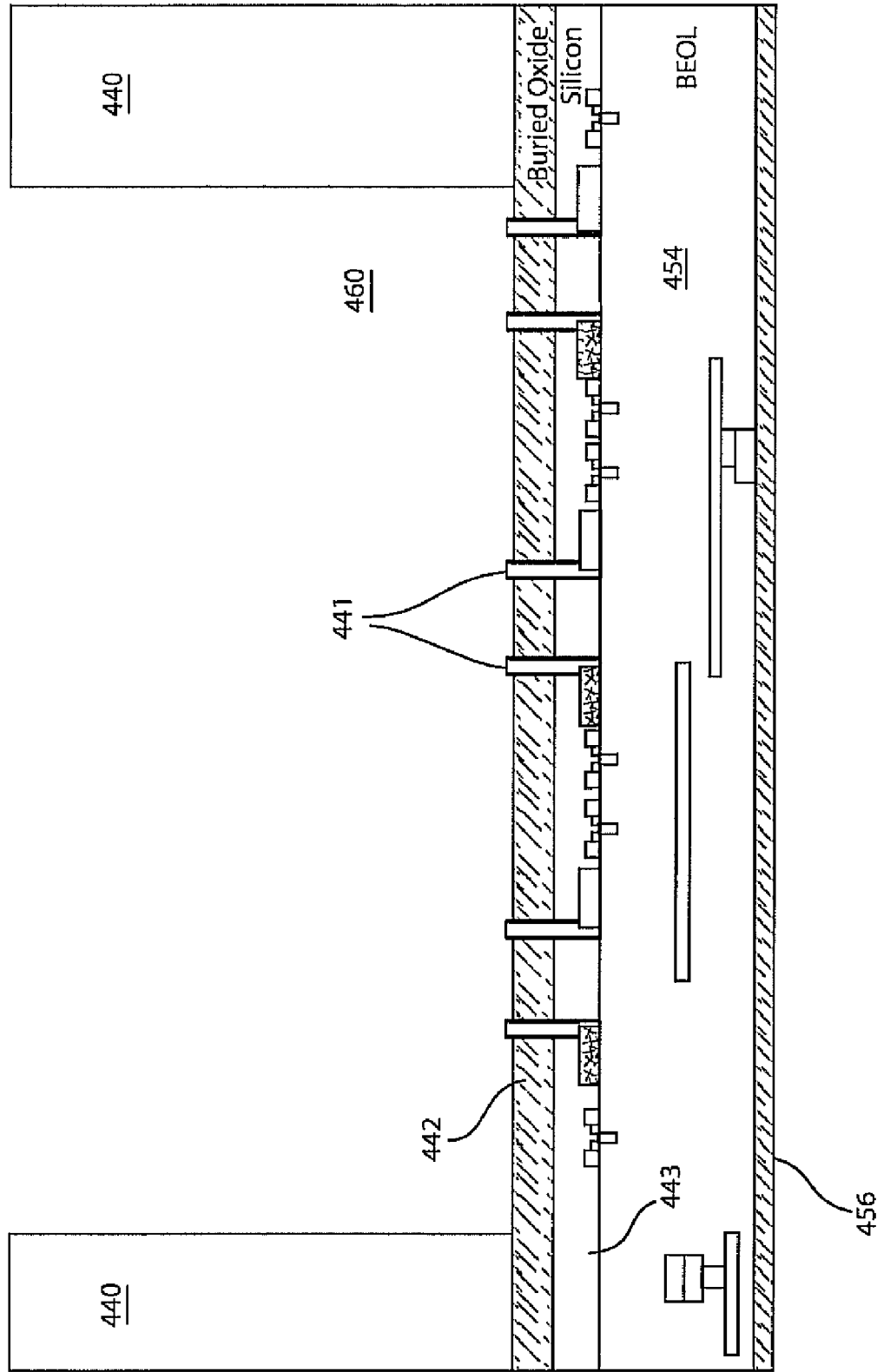
FIG. 27 is a cross-sectional view showing backside etching to form a cavity.

Referring to FIG. 27, the cavities 460 are formed after etching and the through vias 441 are exposed at the surface of the buried oxide layer 442.

Figure 28:
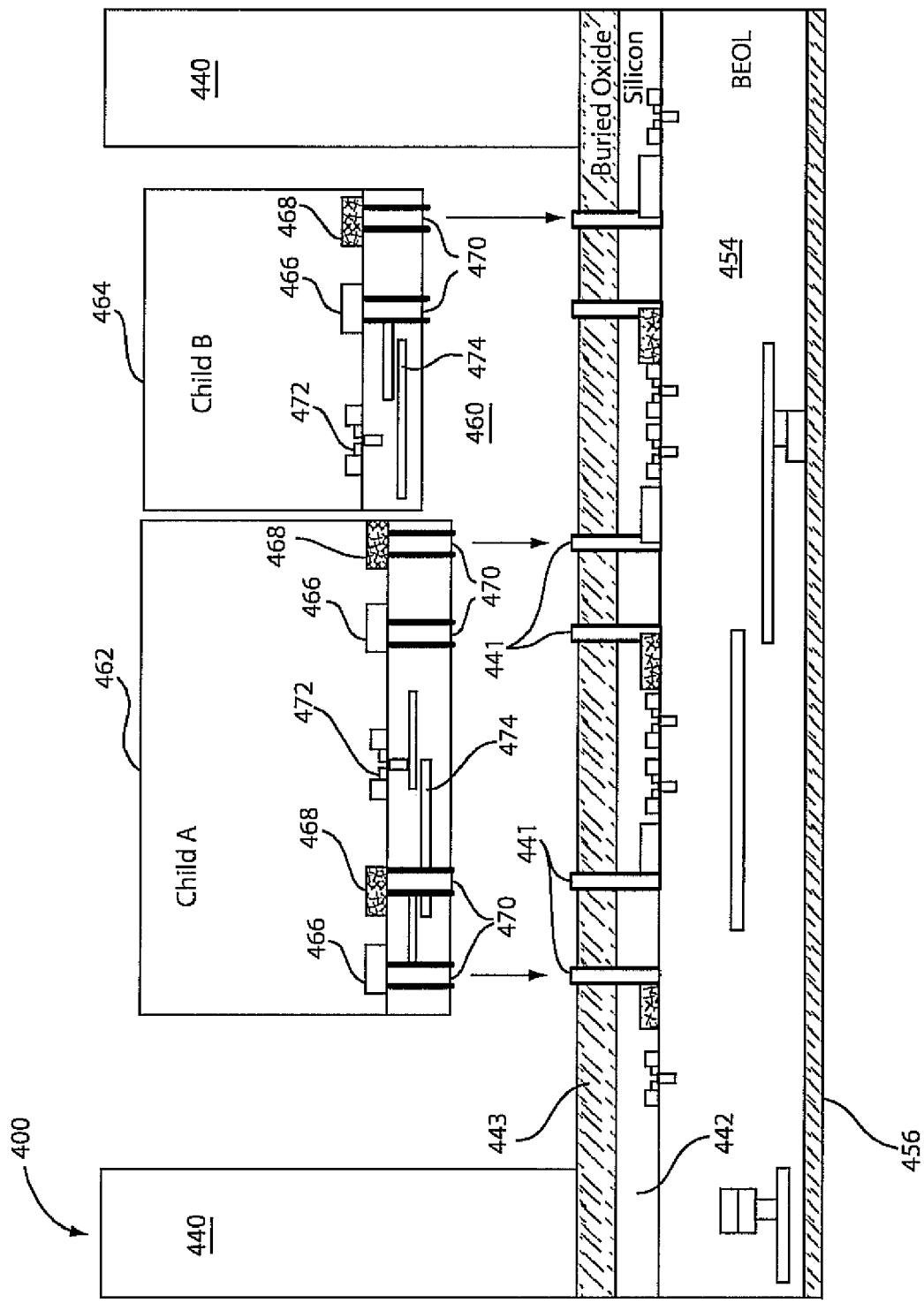
FIG. 28 is a cross-sectional view showing the placement of sub-chips into the backside cavity and aligning the sub-chips with the optical through vias.
Figure 29:
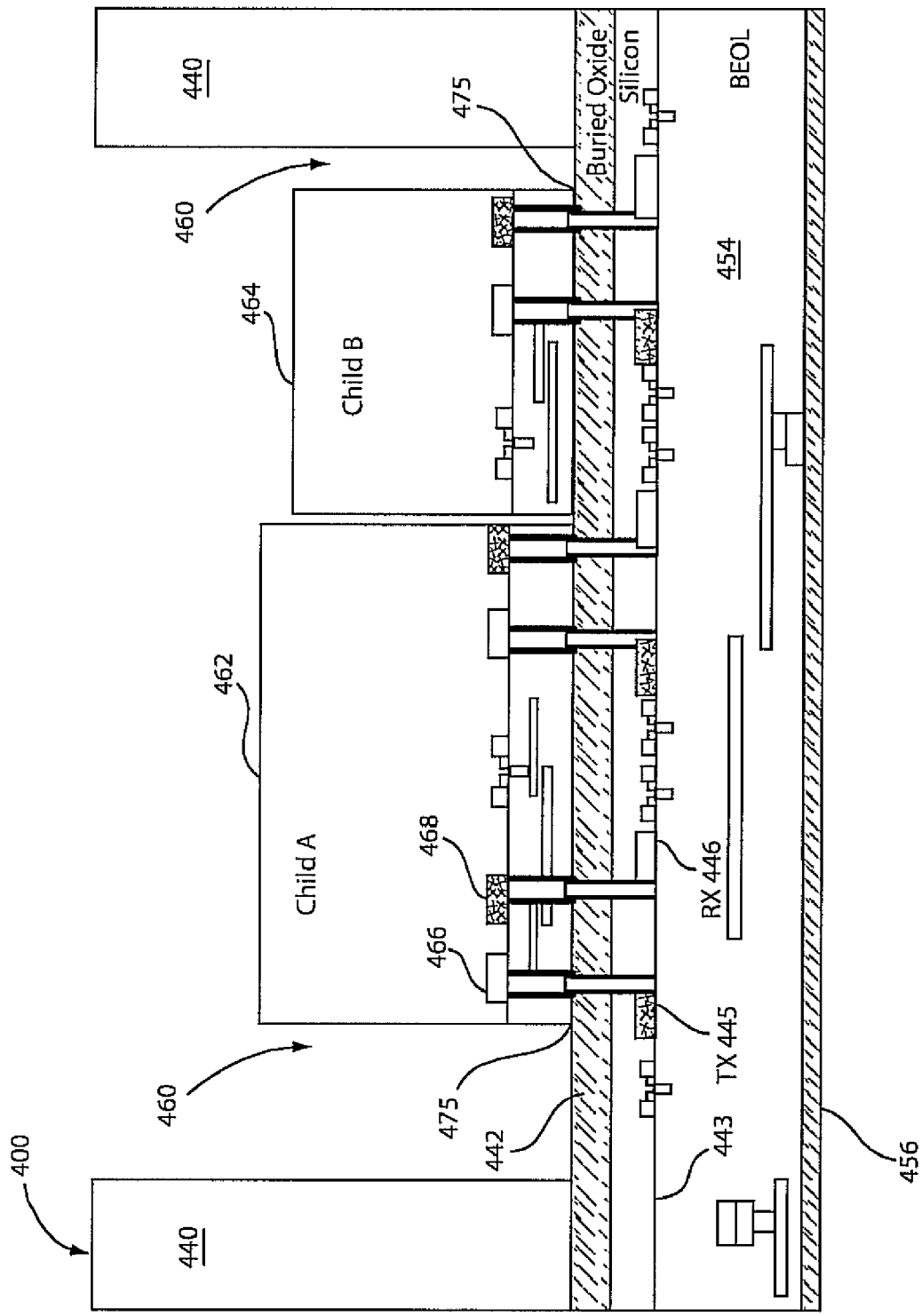
FIG. 29 is a cross-sectional view showing bonding of the sub-chips to the optical through vias to permit the sub-chips and components to coact to perform a function.

Referring to FIG. 28, in the embodiment shown, thinned daughter (child) chips 462 and 464 include optical devices 466 (RX) and (TX) 468 and links 470. Links 470 may include the same or similar construction to VOI 441. In one embodiment, links 470 are larger than VOIs 441 to ensure proper light coupling and provide a margin for misalignment between links 470 and VOIs. Chips 462 and 464 may include discrete devices 472 and BEOL metal and devices 474 as needed. Chips 462 and 464 are flipped upside down, placed inside the cavity 460, aligned and bonded to the mother chip 400. The depth of the cavities 460 should be deeper than the thickness of all the daughter chips 462, 464. Since there is no high-temperature step to join solder balls of the daughter chips 462, 464 with the through vias 441 from the mother chip 400, the chips 462, 464 are positioned during a glue process using epoxy 475 as shown in FIG. 29.

Figure 30:
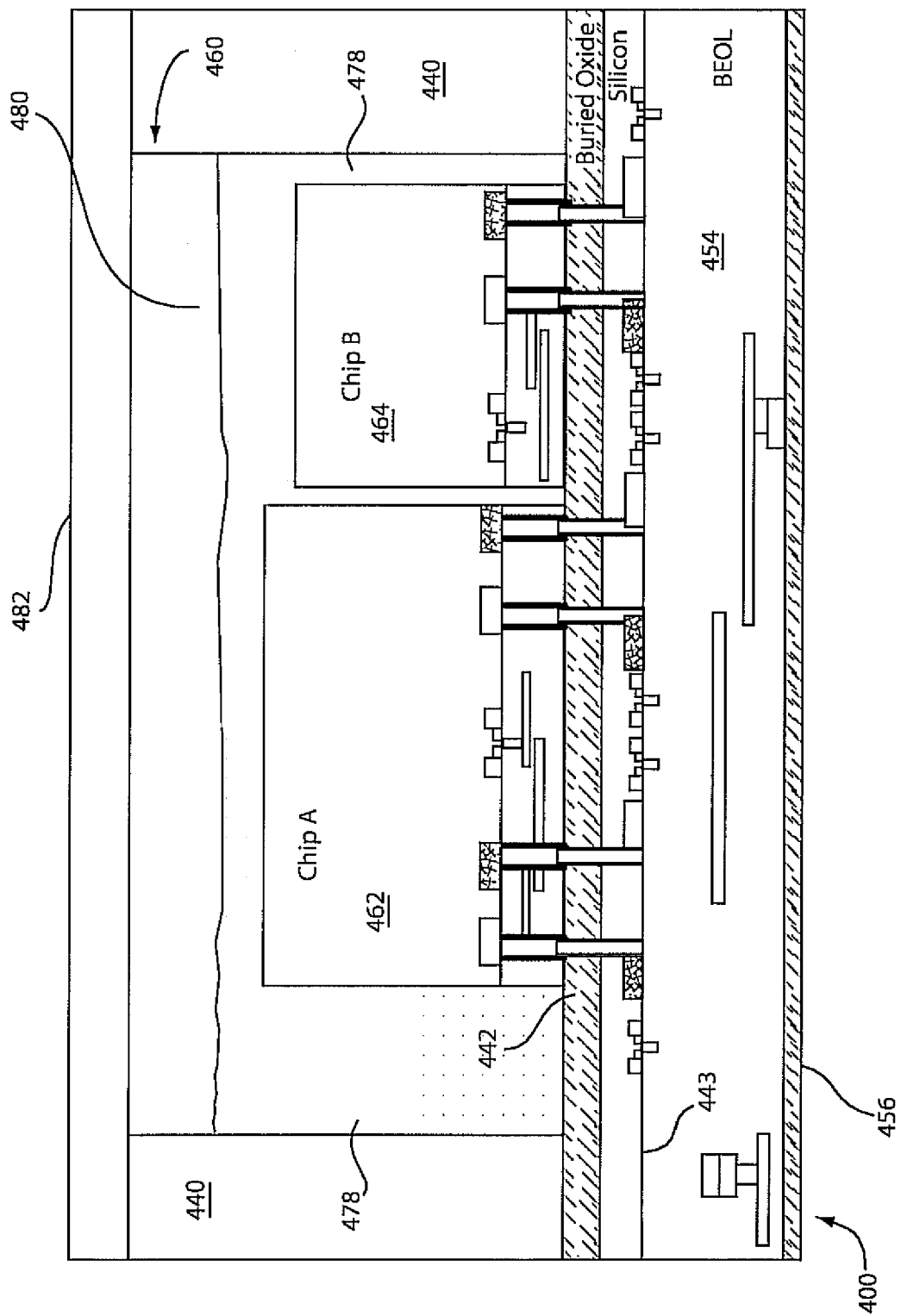
FIG. 30 is a cross-sectional view showing a thermally conductive underfill and deposition of a thermally conductive layer.

Referring to FIG. 30, an under-fill process fills a gap 476 with a thermally conductive agent 478, such as thermal paste, or standard filling polymer to further fasten the chips 462 and 464 in position. A top surface of the cavity 460 is further filled with more thermally conductive material 480 such as, e.g., chemical vapor deposited (CVD) diamond. A metal film 482 or any high-thermal conductive material can be formed on the backside of the wafer to seal the daughter chips 462 and 464 inside the cavity 460.

Figure 31:
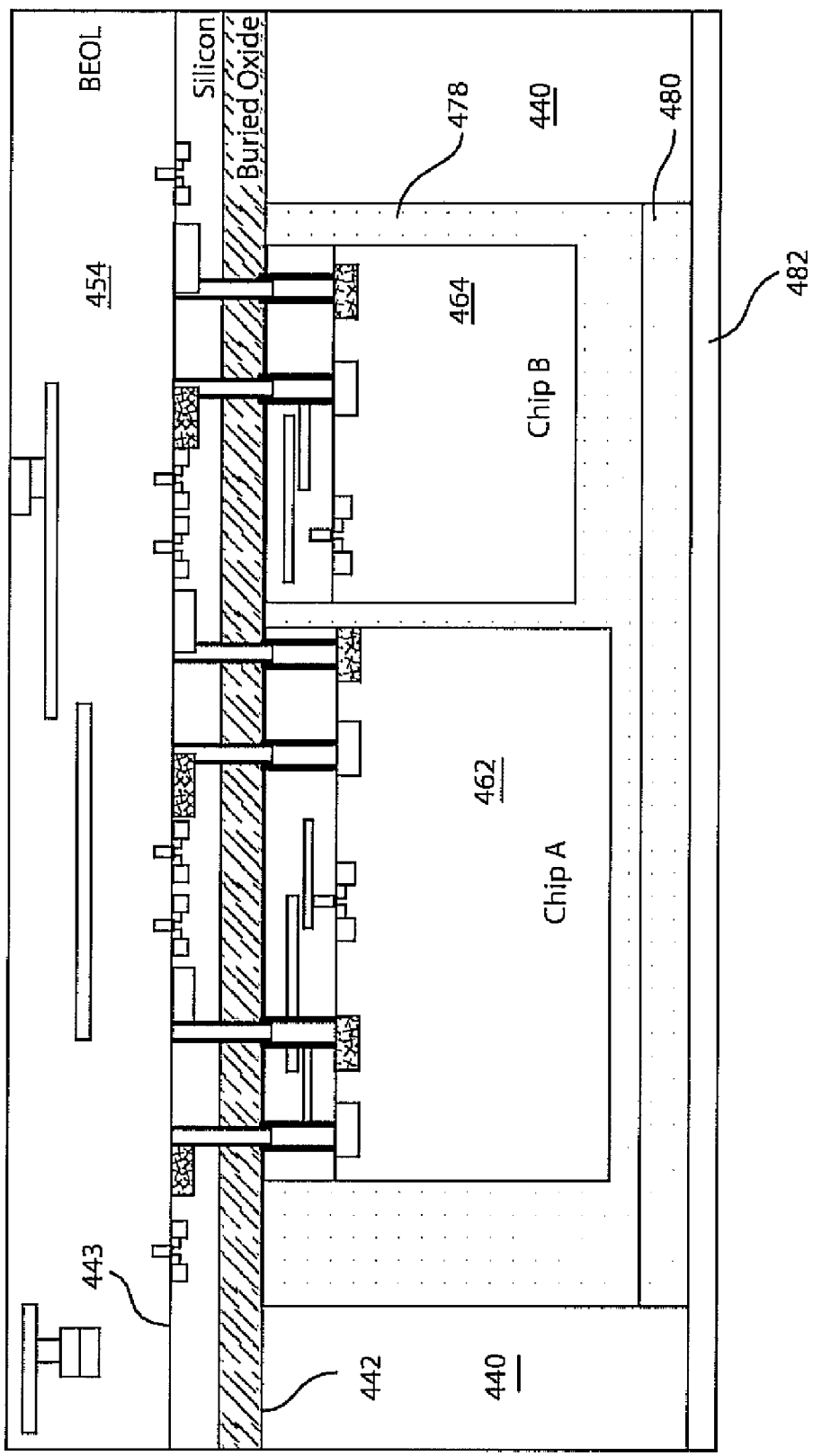
FIG. 31 is a cross-sectional view showing the protective coating being removed from the front side of the wafer.
Figure 32:
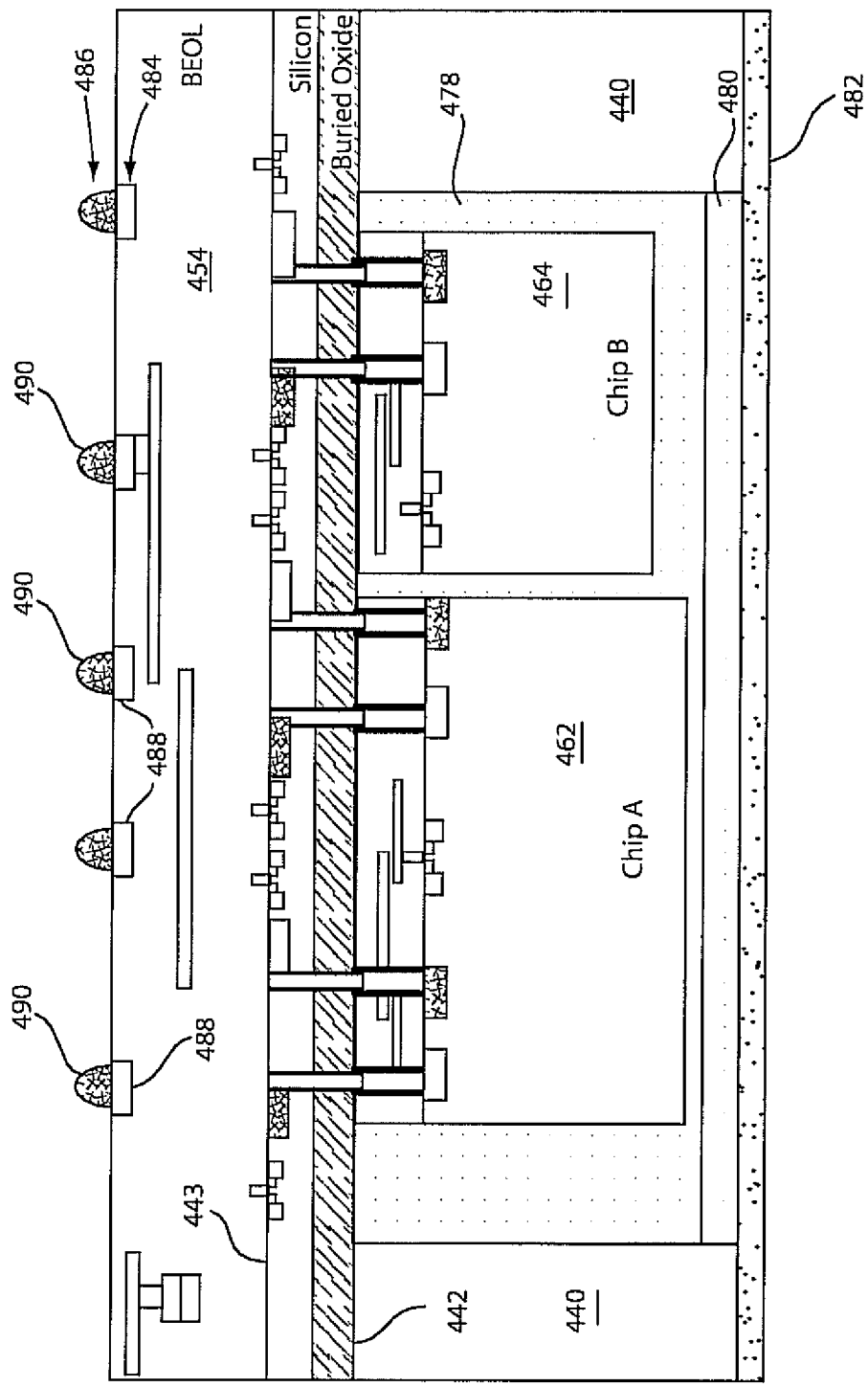
FIG. 32 is a cross-sectional view showing front side global interconnect formation and C4 formation.

Referring to FIG. 31, after the daughter chips 462 and 464 are mounted on the backside, the top protective layer 456 of the mother chip can be stripped. In FIG. 32, more metal layers 484, 486 are formed to provide contact pads 488 and C4 balls 490 which can be formed on the front side of the mother wafer 400.

Figure 33:
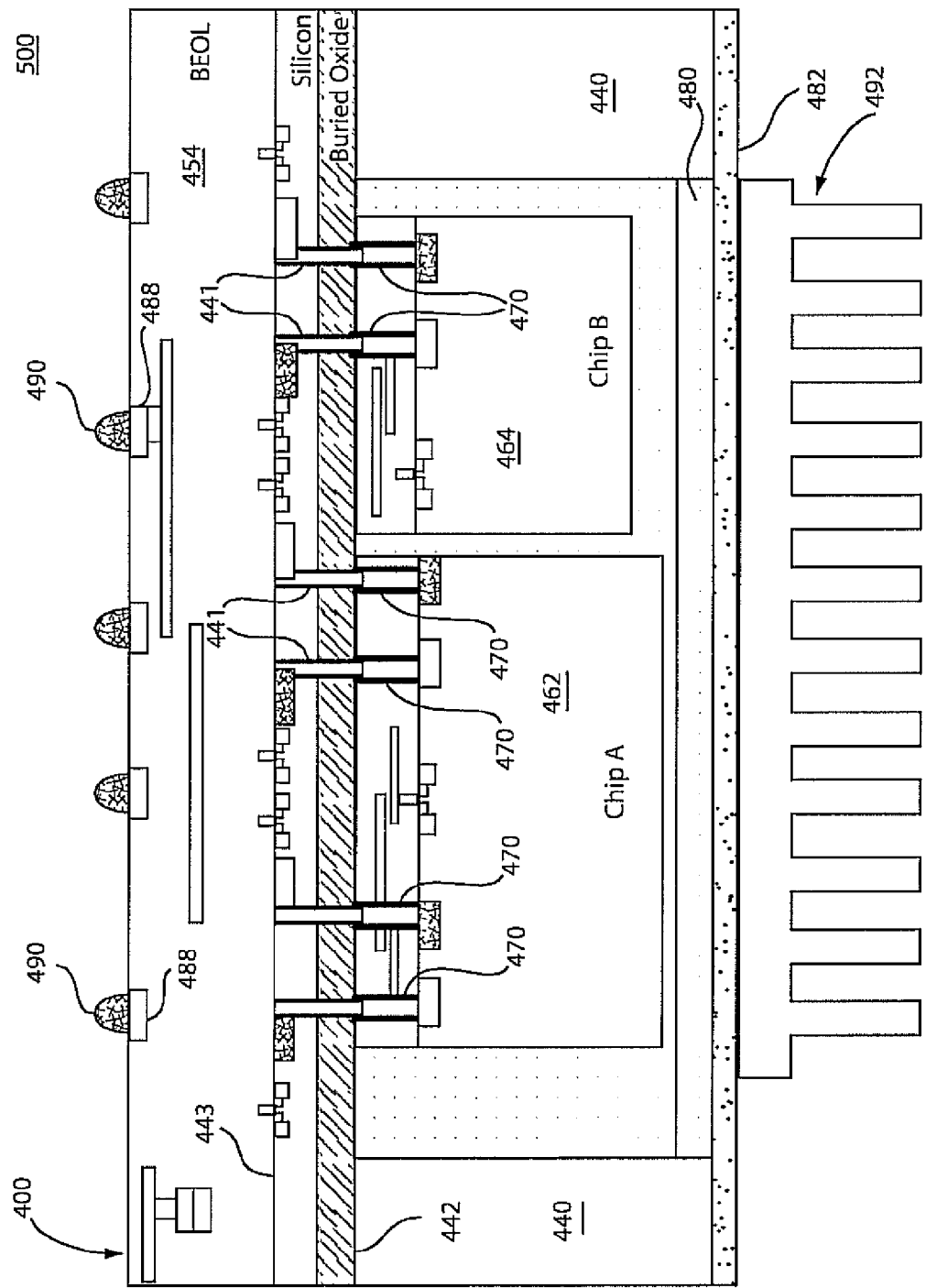
FIG. 33 is a cross-sectional view showing the formation of a backside heat sink.

Advantageously, a double-sided chip assembly can be formed from a SOI wafer, where each assembly has a mother chip on the front side and a plurality of daughter chips mounted on the backside. The buried oxide layer 442 of the SOI wafer is used as a holding plate for through via interconnection (441 and 470) between the mother chip 400 and daughter chips 462 and 464. A conventional heat-sink 492 can be mounted on the backside of the chip assembly 500 as shown in FIG. 33.

Figure 34:
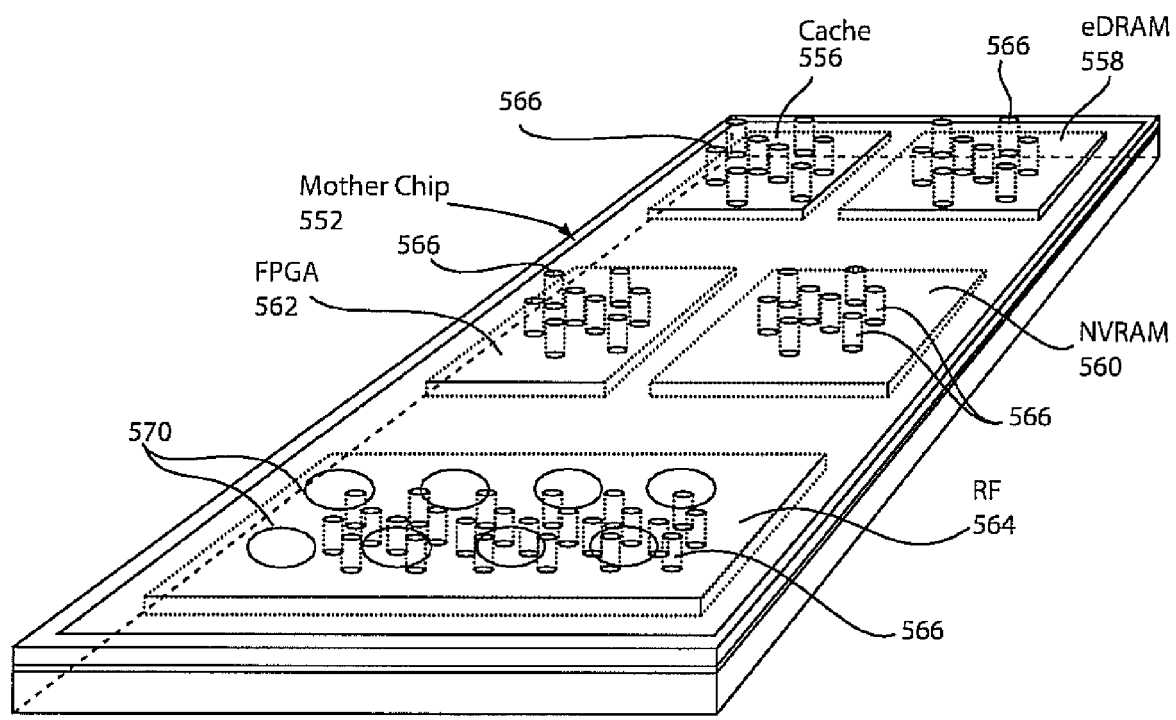
FIG. 34 is a perspective view showing a plurality of sub-chips placed and connected by optical through vias to a mother chip in accordance with one embodiment.

Referring to FIG. 34, an SOI wafer scale package 550 is illustratively, which has one mother chip 552, such as, a processor formed on top of a silicon layer 554 to achieve high performance, and several daughter chips 556-564, such as an SRAM cache 556, eDRAM 558, NVRAM 560, FPGA 562, and a high-speech RF 564 interface chips mounted on the backside of the assembly. The VOIs 566 are formed between the mother chip(s) 552 and all the daughter chips 556-564. While electrical contact elements 570 may be formed to provide interconnects between mother chip and the outside world.

Figure 35:
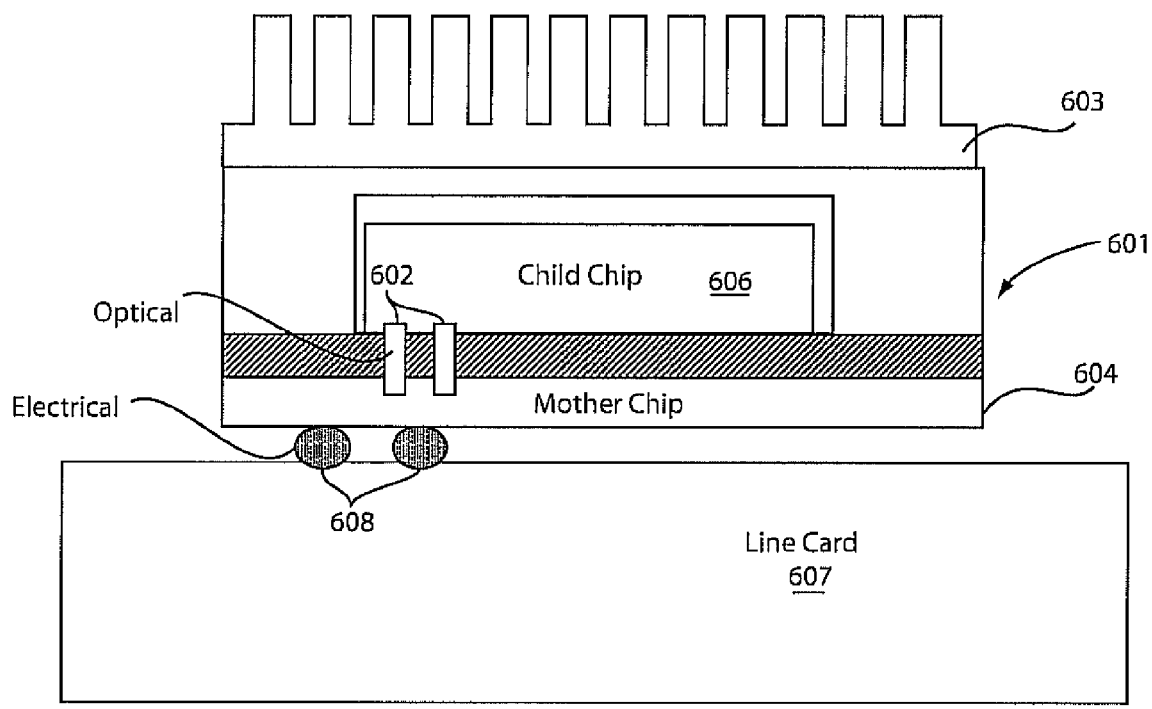
FIG. 35 is a cross-sectional view of a package having a child chip connected to a mother chip by optical through vias and the mother chip connected to an external device by electrical connections.

Referring to FIG. 35, in accordance with one illustrative embodiment, an SOI wafer 601 is fabricated such that a link between a mother chip 604 to a child chip 606 is made via an optical interconnect or VOI 602. The mother chip 604 may be connected to the outside world, e.g., a line card 607 by an electrical connection 608. A heat sink 610 is also shown.

Figure 36:
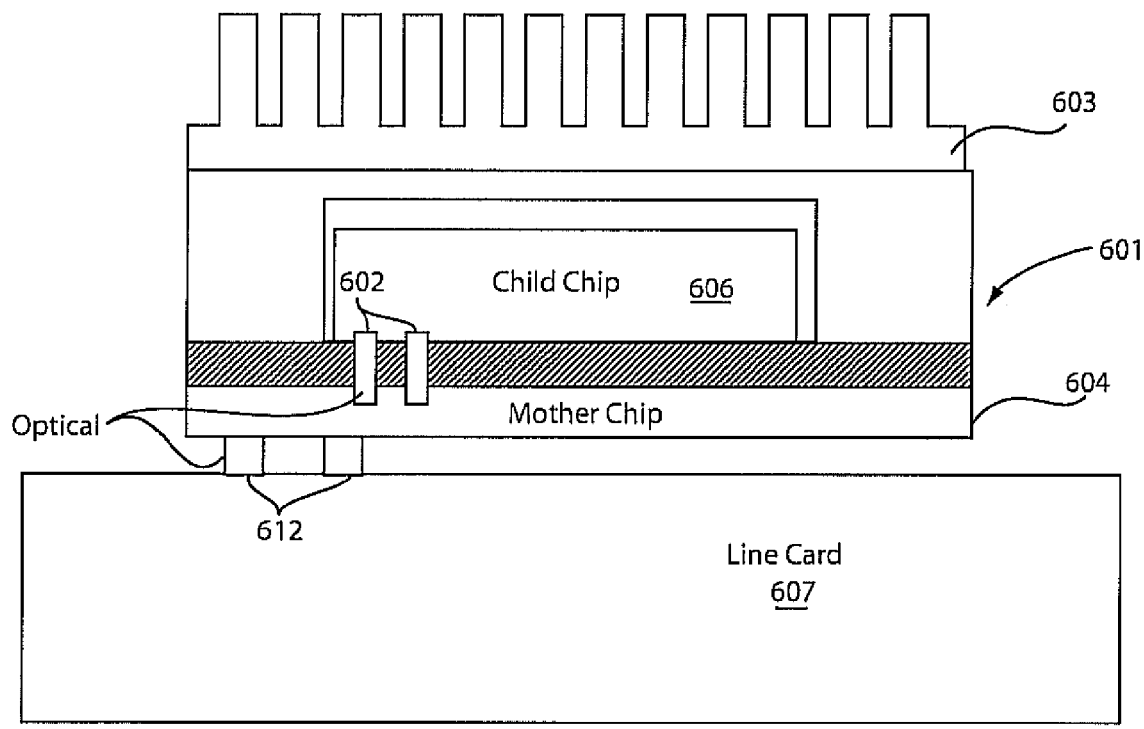
FIG. 36 is a cross-sectional view of a package having a child chip connected to a mother chip by optical through vias and the mother chip connected to an external device by optical connections.
Figure 37:
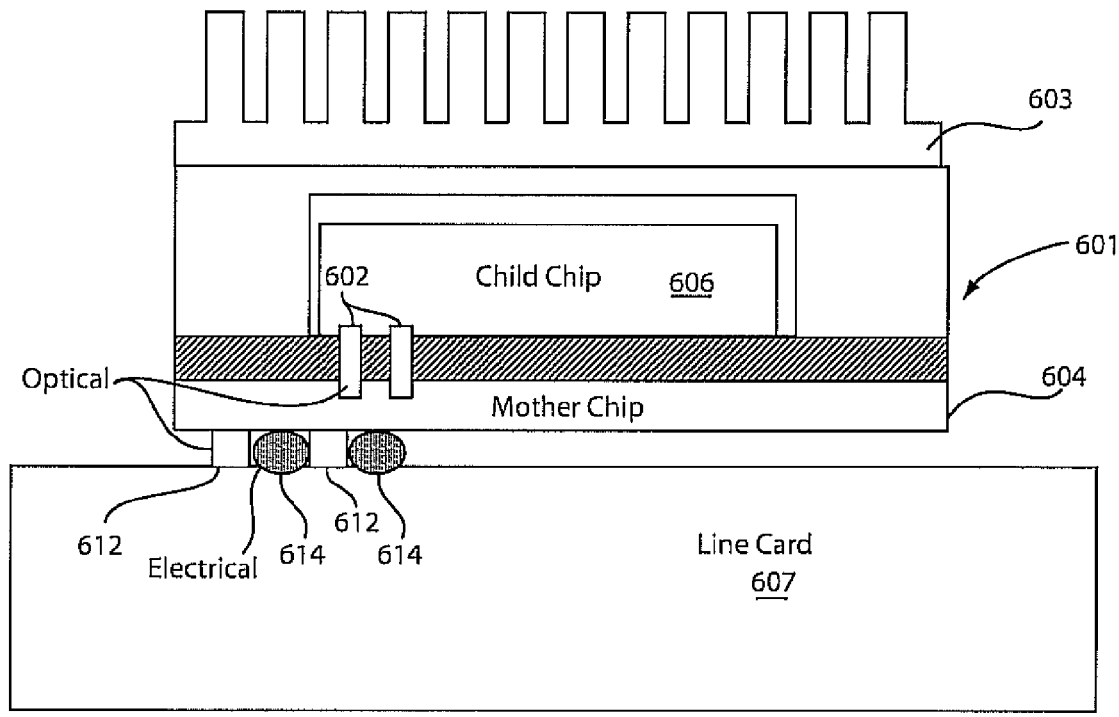
FIG. 37 is a cross-sectional view of a package having a child chip connected to a mother chip by optical through vias and the mother chip connected to an external device by optical and electrical connections.
Figure 38:
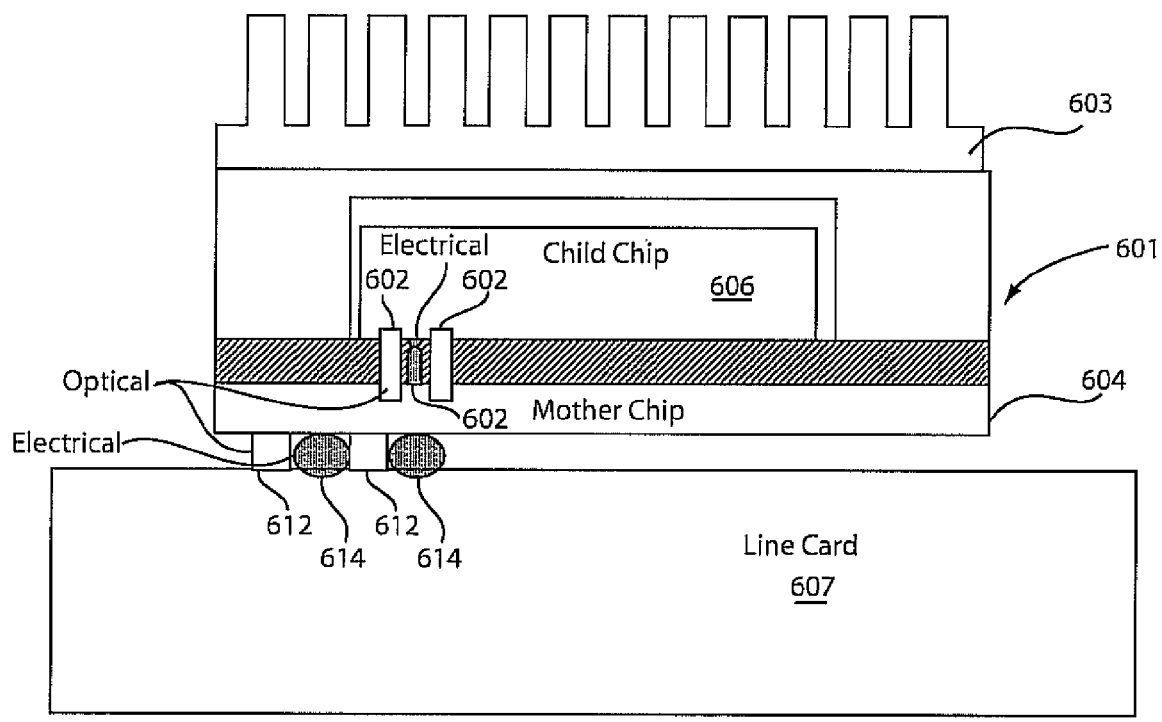
FIG. 38 is a cross-sectional view of a package having a child chip connected to a mother chip by optical and electrical through vias and the mother chip connected to an external device by optical and electrical connections.

Based on the same principle, the child chip 606 as well as the mother chip 604 can be provided with only optical interconnects as shown in FIGS. 36, 37 and 38 assuming that line card 606 is equipped with optical transmitting capability.

FIG. 36 illustratively shows optical connections 612 between mother chip 604 and line card 606. It is contemplated any combination of electrical and optical interconnects may be employed on a stack package using an SOI carrier. FIG. 37 shows optical connection 612 in addition to electrical connections 614 between the mother chip 604 and line card 607. FIG. 38 illustratively shows electrical connections 616 in addition to optical connections 602 between the child chip 606 and the mother chip 604.

Having described preferred embodiments of a device and method for fabricating double-sided SOI wafer scale package with buried oxide optical through via connections (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming a semiconductor package, comprising the steps of:
   forming an optical through via through a first side of a wafer;
   forming a cavity on a second side of the wafer exposing a portion of the optical through via; and
   placing at least one sub-chip in the cavity and optically coupling the sub-chip to the optical through via.

2. The method as recited in claim 1, wherein the wafer includes a silicon-on-insulator wafer and forming an optical through via through a first side of a wafer includes etching a via hole through a top silicon layer and a buried dielectric layer and filling the via hole with an optical material.

3. The method as recited in claim 1, wherein the step of forming a cavity on a second side of the wafer exposing a portion of the through via includes etching a silicon substrate of the wafer to expose the portion of the optical through via.

4. The method as recited in claim 1, wherein placing at least one sub-chip in the cavity and optically coupling the sub-chip to the optical through via includes aligning the optical through via with an optical link in the sub-chip to permit optical communications therebetween.

5. The method as recited in claim 1, wherein connecting the sub-chip to the optical through via includes employing optical and electrical connections.

6. The method as recited in claim 1, further comprising providing optical and electrical connections between the wafer and an external device.

7. The method as recited in claim 1, further comprising optically connecting a device on the wafer with the subchip through the optical through via to provide optical communication therebetween.

8. A method for forming a semiconductor package, comprising the steps of:
   forming an optical through via through a first side of a wafer;
   forming a cavity on a second side of the wafer exposing a portion of the optical through via;
   placing at least one sub-chip in the cavity and optically coupling the sub-chip to the optical through via to permit optical signal communication through the optical through via; and
   connecting the sub-chip to the wafer using electrical connections.

9. The method as recited in claim 8, wherein the wafer includes a silicon-on-insulator wafer and forming an optical through via through a first side of a wafer includes etching a via hole through a top silicon layer and a buried dielectric layer and filling the via hole with an optical material.

10. The method as recited in claim 8, wherein the step of forming a cavity on a second side of the wafer exposing a portion of the through via includes etching a silicon substrate of the wafer to expose the portion of the optical through via.

11. The method as recited in claim 8, wherein placing at least one sub-chip in the cavity and optically coupling the sub-chip to the optical through via includes aligning the optical through via with an optical link in the sub-chip to permit optical communications therebetween.

12. The method as recited in claim 8, further comprising providing optical and electrical connections between the wafer and an external device.

13. The method as recited in claim 8, further comprising optically communicating between the wafer and the subchip through the optical through via.

* * * * *